(12) United States Patent
Majhi et al.

(10) Patent No.: US 12,707,691 B2
(45) Date of Patent: Aug. 11, 2026

(54) CONTACTS WITH INTERFACE FERMI LEVEL TUNING LAYERS

(71) Applicant: Intel Corporation, Santa Clara, CA (US)

(72) Inventors: Prashant Majhi, San Jose, CA (US); Anand Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 237 days.

(21) Appl. No.: 17/555,247

(22) Filed: Dec. 17, 2021

(65) Prior Publication Data

US 2023/0197825 A1 Jun. 22, 2023

(51) Int. Cl.

*H10D 62/83* (2025.01)
*H10D 30/62* (2025.01)
*H10D 64/62* (2025.01)

(52) U.S. Cl.

CPC ............ *H10D 62/83* (2025.01); *H10D 64/62* (2025.01); *H10D 30/6211* (2025.01)

(58) Field of Classification Search

CPC .... H10D 62/83; H10D 64/62; H10D 30/6211; H10D 30/014; H10D 30/024; H10D 30/43; H10D 30/62; H10D 30/6713; H10D 30/6735; H10D 30/6757; H10D 30/6219; H10D 64/256; H10D 62/82; H10D 62/121; H10D 62/151; H10D 84/834; H10D 64/64; B82Y 10/00

See application file for complete search history.

(56) References Cited

U.S. PATENT DOCUMENTS 10,283,629 B2 * 5/2019 Engel et al. ......... H10D 30/031
11,037,783 B2 * 6/2021 Li ....................... H10D 62/235

(Continued)

OTHER PUBLICATIONS

Chen, Yi-Hsun et al., "Oxidized-monolayer tunneling barrier for strong Fermi-level depinning in layered InSe transistors," NPJ, 2D Materials and Applications (2019) 7 pages.

(Continued)

*Primary Examiner* — Christine S. Kim
*Assistant Examiner* — Nathalie R Fayette
(74) *Attorney, Agent, or Firm* — Alliance IP, LLC

(57) ABSTRACT

Transition metal dichalcogenide (TMD) monolayers are positioned between a contact metal and a semiconductor to pin the Fermi level at the metal-semiconductor interface. The pinned Fermi level can provide for a lower Schottky barrier height between the contact metal and semiconductor than if no TMD were present at the contact metal-semiconductor interface. The height of the Schottky barrier can be tuned through the selection of the transition metal dichalcogenide used for the monolayer. Transition metal dichalcogenides have the chemical formula $MX_2$, where M is a transition metal and X=sulfur, selenium, or tellurium. The transition metal dichalcogenides used for metal contact-semiconductor interfaces can have M=titanium, platinum, molybdenum, tungsten, erbium, rhodium, or lanthanum. A lower Schottky barrier height can reduce contact resistance, which can improve transistor performance as the parasitic resistance of source/drain channels approach that of transistor channel as transistor geometries continued to scale.

24 Claims, 10 Drawing Sheets

(56) References Cited

U.S. PATENT DOCUMENTS

| | | | | |
|---|---|---|---|---|
| 2020/0135634 | A1* | 4/2020 | Chiang et al. | H10D 64/251 |
| 2020/0303373 | A1* | 9/2020 | Glass et al. | H10D 84/017 |
| 2021/0226011 | A1* | 7/2021 | Lee et al. | H10D 30/62 |
| 2021/0359099 | A1 | 11/2021 | Shen et al. | |

OTHER PUBLICATIONS

Kim, Changsik et al., "Fermi Level Pinning at Electrical Metal Contacts of Monolayer Molybedenum Dichalcogenides," ACS Nano, Jan. 2017 (10 pages).

EPO European Extended Search Report in EP Application Serial No. 22209192.8 mailed on May 19, 2023, 7 pages.

* cited by examiner

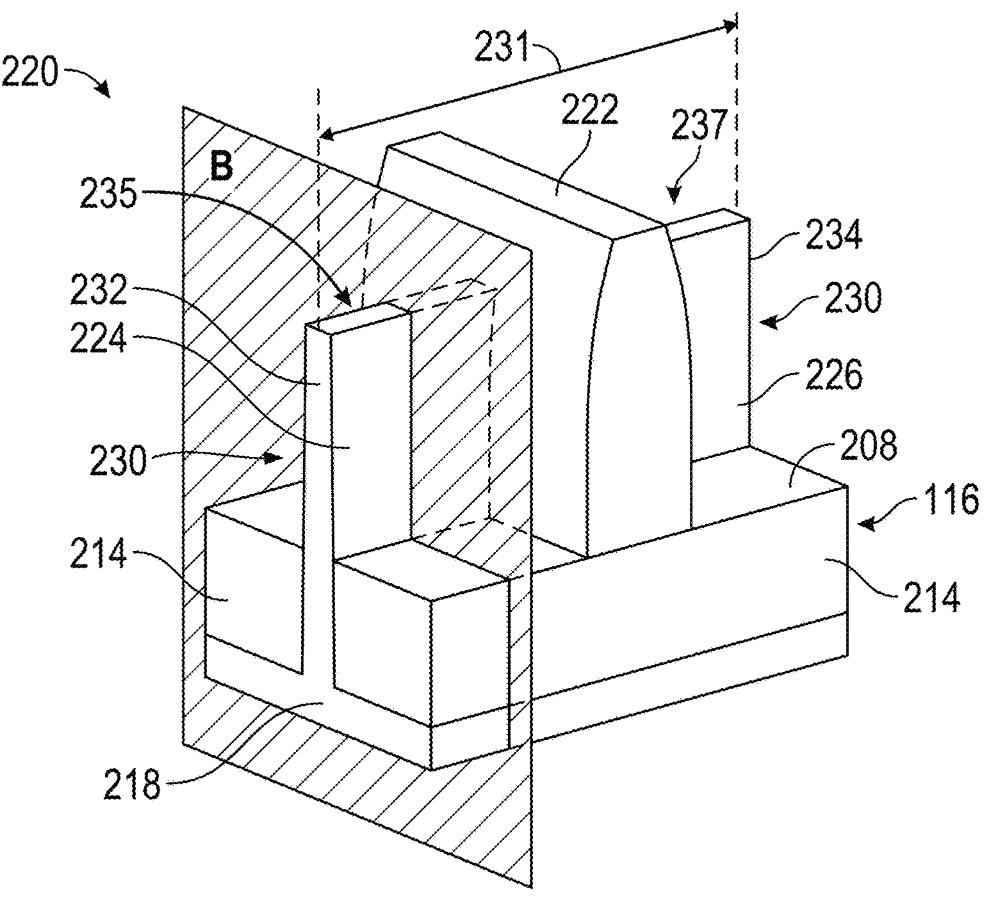
FIG. 2A
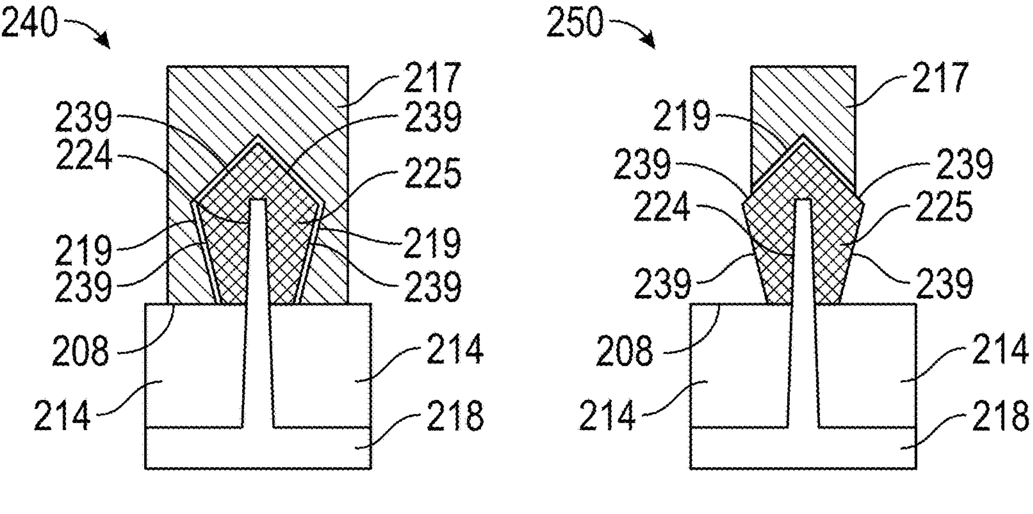
FIG. 2B
FIG. 2C

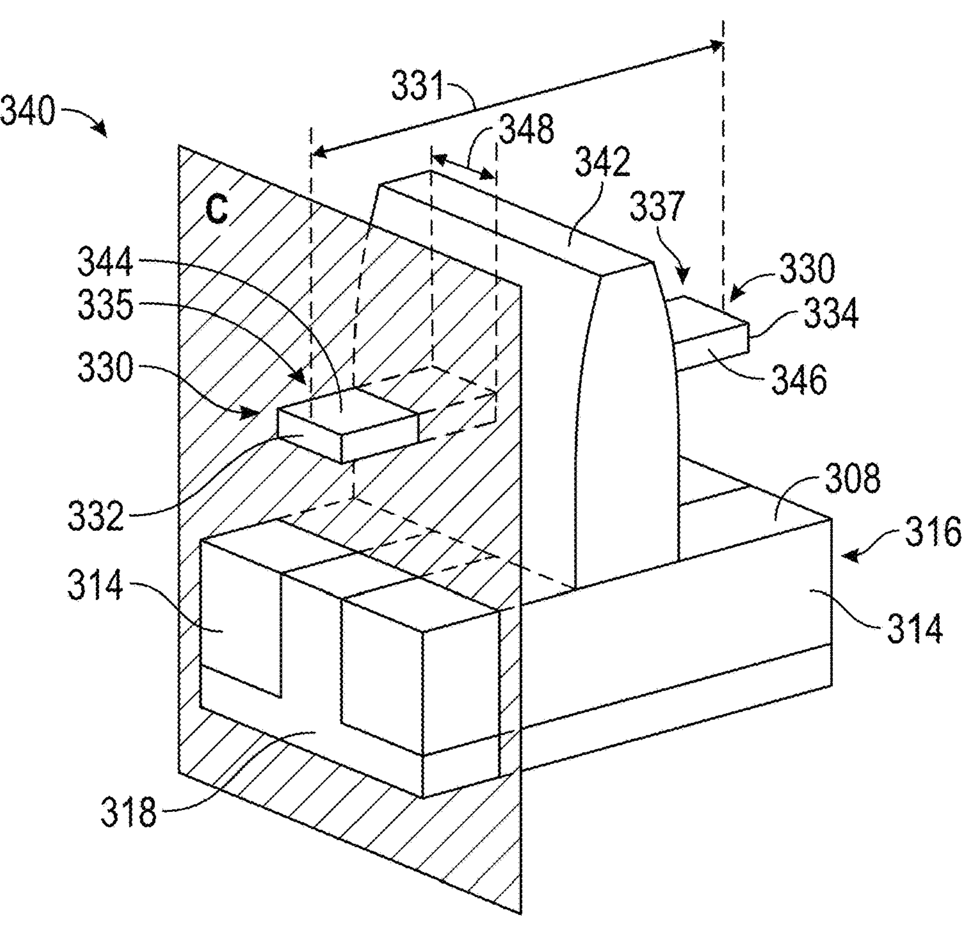
FIG. 3A
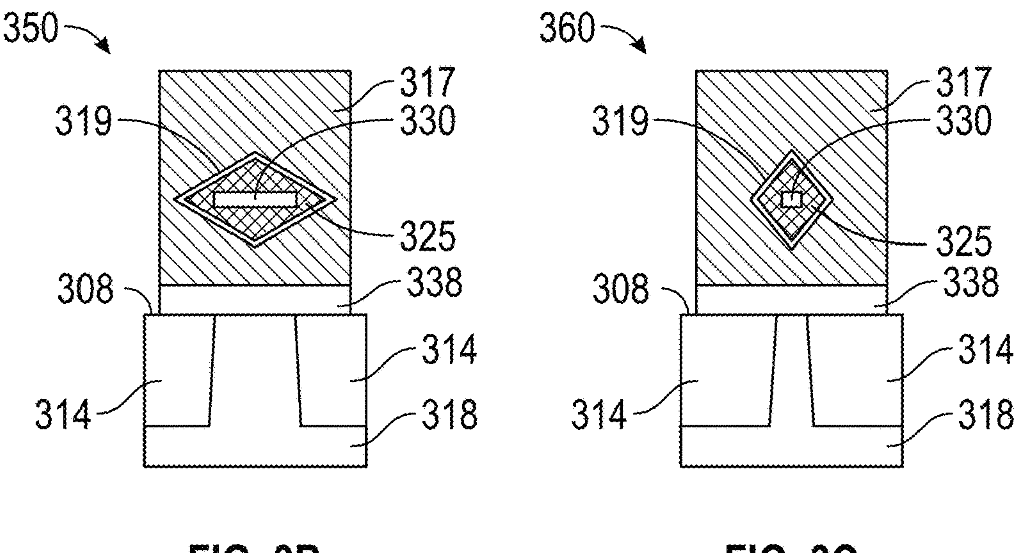
FIG. 3B
FIG. 3C 600
602
604
608
612
616
620
624
628
632
636

CONTACTS WITH INTERFACE FERMI LEVEL TUNING LAYERS

BACKGROUND

A Schottky barrier can form at a metal-semiconductor interface, which can impede the flow of charge carriers across the interface. The resistance of a metal contact to a source or drain region of a transistor depends on the Schottky barrier height, with contacts having a greater Schottky barrier height having a greater resistance.

BRIEF DESCRIPTION OF THE DRAWINGS

FIG. 2A is a simplified perspective view of an example FinFET comprising source/drain contacts with a transition metal dichalcogenide monolayer.

FIG. 2B is a cross-sectional view of the example FinFET of FIG. 2A taken along the source contact region.

FIG. 2C is a cross-sectional view of a variation of the example FinFET of FIG. 2A taken along the source contact region.

FIG. 3A is a simplified perspective view of an example gate-all-around FET (GAAFET) comprising source/drain contacts with a transition metal dichalcogenide monolayer.

FIG. 3B is a cross-sectional view of the example GAAFET of FIG. 3A taken along the source contact region.

FIG. 3C is a cross-sectional view of a variation of the example GAAFET of FIG. 3A taken along the source contact region.

DETAILED DESCRIPTION

Figure 1A:
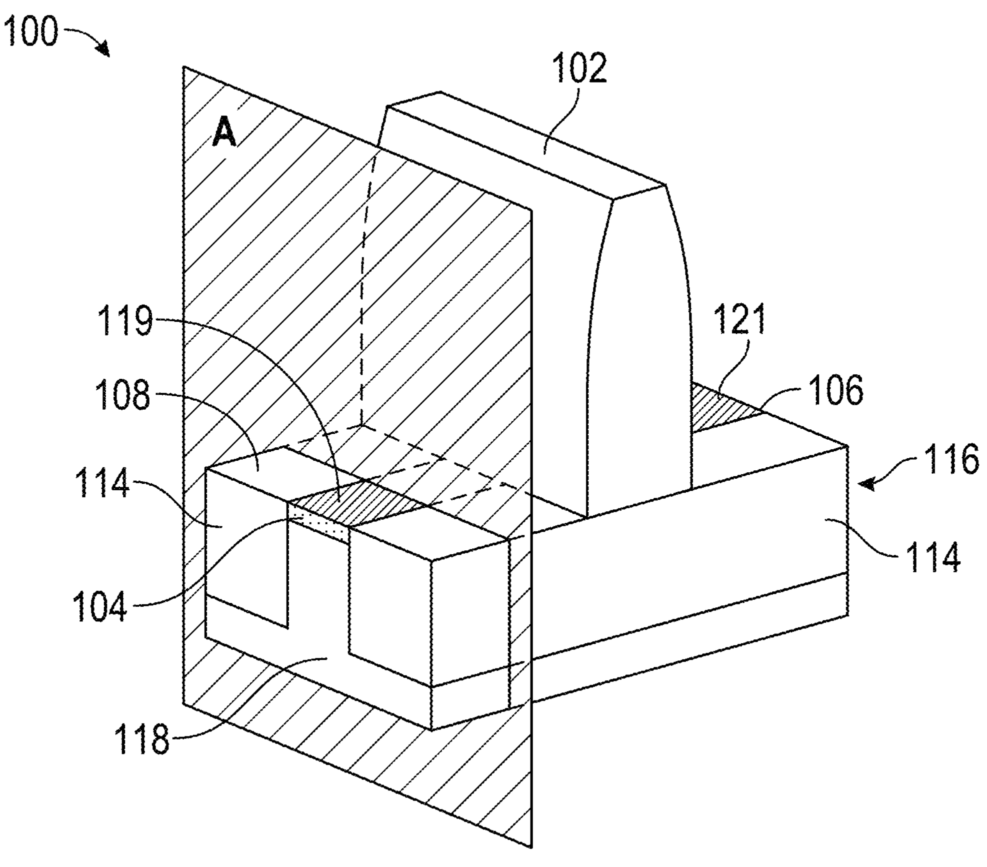
FIG. 1A is a simplified perspective view of an example planar field-effect transistor (FET) comprising source/drain contacts with a transition metal dichalcogenide monolayer.

Transistor architectures are expected to advance from FinFETs to gate-all-around (GAA) field-effect transistors (FETs) and potentially followed by the stacking of (N and P) transistors as transistor scaling continues. While these transistor architecture advances are promising for improved electrostatic control and higher transistor drive strength through increased effective transistor width, there are challenges related to parasitic resistance that can limit transistor performance. As transistor geometries continue to scale down in successive semiconductor manufacturing technology generations, reducing the parasitic resistance of metal contacts to semiconductor source/drain regions become increasingly important as source/drain contact resistance becomes comparable to transistor channel resistance. The development of high-volume manufacturing processes that allow for reduced source/drain contact resistance is an additional challenge that must be met by process development engineers.

Existing efforts to reduce source/drain contact resistance include increasing the metal contact area to source/drain regions in FinFETs and GAAFETs through the use of wrap-around-contacts (discussed in further detail below), the continued exploration of metals and other materials (e.g., silicides) with low Schottky barrier height, and increasing the dopant levels in the source/drain regions (by, for example, flash or laser anneals, plasma doping) to reduce Schottky barrier height. However, wrap-around contacts can suffer from non-conformal doping concentrations along the source/drain surfaces and the impact of materials with a low Schottky barrier height can be limited due to Fermi level pinning at a metal-semiconductor interface due to the presence of metal-induced gap states.

Described herein are metal contacts to semiconductor regions comprising a transition metal dichalcogenide (TMD) monolayer positioned between the metal and semiconductor. The presence of this 2D material at the metal-semiconductor interface pins the interface Fermi level. The interface Fermi layer (and thus the Schottky barrier height) can be tuned based on the TMD used for the monolayer. With appropriate TMD selection for the monolayer, the Schottky barrier height at the metal-semiconductor interface can be less than that if no TMD monolayer were present. Thus, the resistance of a metal contact can be reduced by the presence of a TMD monolayer at the metal-semiconductor interface through the selection of an appropriate TMD to be used for the monolayer. If the semiconductor being contacted by the metal is part of a transistor source/drain region of a transistor, the reduced contact resistance may result in improved transistor performance. The metal contact technologies disclosed herein can be used in planar FETs, FinFETs, gate-all-around field-effect transistors (GAAFETs), stacked GAAFETs, and other transistor architectures. Selective processing allows for different TMD monolayers to be formed in contacts to n-type and p-type source/drain regions.

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact with each other and "coupled" may indicate elements co-operate or interact with each other, but they may or may not be in direct physical or electrical contact. Furthermore, the terms "comprising," "including," "having," and the like, as used with respect to embodiments of the present disclosure, are synonymous.

Terms modified by the word "substantially" include arrangements, orientations, spacings, or positions that vary slightly from the meaning of the unmodified term. For example, the portion of a first layer or feature that is substantially perpendicular to a second layer or feature can include a first layer or feature that is +/−20 degrees from a second layer or feature, a first surface that is substantially parallel to a second surface can include a first surface that is within several degrees of parallel from the second surface, and a first edge that is substantially aligned with a second edge can be misaligned on the order of ones of nanometers.

Certain terminology may also be used herein for the purpose of reference only, and thus are not intended to be limiting. For example, terms such as "upper," "lower," "above," "below," "bottom," and "top" refer to directions in the Figures to which reference is made. Further, terms such as "front," "back," "rear,", "side", "vertical", and "horizontal" describe the orientation and/or location of portions of the component within a consistent but arbitrary frame of reference which is made clear by reference to the text and the associated Figures describing the component under discussion. Such terminology may include the words specifically mentioned above, derivatives thereof, and words of similar import.

As used herein, the phrase "located on" in the context of a first layer or component located on a second layer or component refers to the first layer or component being directly physically attached to the second part or component (no layers or components between the first and second layers or components) or physically attached to the second layer or component with one or more intervening layers or components. For example, with reference to FIG. 2B, the source contact metal 217 is located on the source semiconductor layer 225 (with the intervening TMD monolayer 219).

As used herein, the term "adjacent" refers to layers or components that are in physical contact with each other. That is, there is no layer or component between the stated adjacent layers or components. For example, a layer X that is adjacent to a layer Y refers to a layer that is in physical contact with layer Y.

As used herein, the term "integrated circuit component" refers to a packaged or unpacked integrated circuit product. A packaged integrated circuit component comprises one or more integrated circuit dies mounted on a package substrate with the integrated circuit dies and package substrate encapsulated in a casing material, such as a metal, plastic, glass, or ceramic. In one example, a packaged integrated circuit component contains one or more processor units mounted on a substrate with an exterior surface of the substrate comprising a solder ball grid array (BGA). In one example of an unpackaged integrated circuit component, a single monolithic integrated circuit die comprises solder bumps attached to contacts on the die. The solder bumps allow the die to be directly attached to a printed circuit board. An integrated circuit component can comprise one or more of any computing system component described or referenced herein or any other computing system component, such as a processor unit (e.g., system-on-a-chip (SoC), processor core, graphics processor unit (GPU), accelerator, chipset processor), I/O controller, memory, or network interface controller.

In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives within the scope of the claims.

Reference is now made to the drawings, which are not necessarily drawn to scale, wherein similar or same numbers may be used to designate same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

FIGS. 1A, 2A, 3A, and 4A are simplified perspective views of an example planar FET, FinFET, GAAFET, and stacked GAAFET comprising source/drain contacts with a transition metal dichalcogenide monolayer. FIG. 1B is a cross-sectional view of the transistor 100 of FIG. 1A taken along a plane A that passes through the source contact region of transistor 100. FIGS. 2A-2B are cross-sectional views of the transistor 220 of FIG. 2A taken along a plane B that passes through the source contact region of transistor 220. FIGS. 3B-3C are cross-sectional views of the transistor 340 of FIG. 3A taken along a plane C that passes through the source contact region of transistor 340. FIGS. 4B-4C are cross-sectional view of the transistor 440 of FIG. 4A taken along a plane D across the source contact region of transistor 440.

Figure 1B:
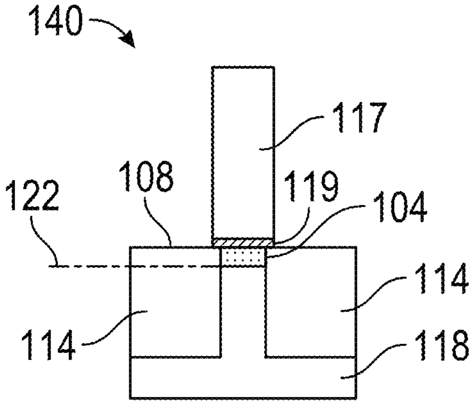
FIG. 1B is a cross-sectional view of the example planar FET of FIG. 1A taken along the source contact region.

FIG. 1A is a perspective view of an example planar FET 100 comprising a gate 102, a source region 104, and a drain region 106. The transistor 100 is formed on a substrate 116 comprising a surface 108, a bulk region 118, and isolation regions 114 that separate the source and drain regions 104 and 106 from other transistors. A TMD monolayer 119 is positioned between the source region 104 a source contact metal 117 and a TMD monolayer 121 is positioned between the drain region 106 and a drain contact metal (source contact metal 117 and drain contact metal not shown in FIG. 1A). The transistor 100 is planar in that the source region 104 and the drain region 106 are planar with respect to the surface 108 of the substrate 116. FIG. 1B is a cross-sectional view of the planar FET 100 taken along the source contact region of transistor 100. Cross-sectional view 140 illustrates a source contact metal 117 located on the source region 104, with the TMD monolayer 119 positioned between the source contact metal 117 and the source region 104. The source region 104 extends from the surface 108 of the substrate 116 to a depth 122 within the substrate 116.

As will be discussed in greater detail below, the TMD monolayers in the planar FET source and drain contacts act to pin the Fermi levels of the interface between the source contact metal 117 and the source region 104 and the interface between the drain contact metal and the drain region 106.

The source region 104 and the drain region 106 can comprise silicon, silicon and germanium, or another suitable semiconductor.

FIG. 2A is a perspective view of an example FinFET 220 comprising a gate 222, a source region 235, a drain region 237, and a fin 230. The transistor 220 is formed on a substrate 216 comprising a surface 208, a bulk region 218, and isolation regions 214 that separate the source and drain regions 235 and 237 from other transistors. The fin 230 extends from the surface 208 of a substrate 216 and extends along a length 231 from a first end 232 of the fin 230 to a second end 234 of the fin 230. The gate 222 controls the flow of current from a source portion 224 of the fin 230 to a drain portion 226 of the fin 230. The channel region of the transistor 220 is formed by the portion of the fin 230 encompassed by the gate 222.

The source region 235 comprises the source portion 224 of the fin 230 and a source semiconductor layer 225 (not shown in FIG. 2A) is positioned adjacent to and encompasses at least a portion of the length 231 of the fin 230 (the source portion 224 of the fin 230). The source semiconductor layer 225 comprises one or more outer surfaces 239 (the surfaces of the source semiconductor layer 225 not positioned adjacent to the surface 208 of the substrate 216). A source contact metal 217 is located on at least a portion of the outer surfaces 239 along at least a portion of a length of the source semiconductor layer 225. A TMD monolayer 219 is positioned between the source semiconductor layer 225 and the source contact metal 217. The length 231 of the fin 230 and the length of the source semiconductor layer 225 extend in a same direction that is parallel to the surface 208 of the substrate 216.

The drain region 237 comprises a drain portion 226 of the fin 230 and a drain semiconductor layer (not shown in FIG. 2A) is positioned adjacent to and encompasses at least a portion of the length 231 of the fin 230 (the drain portion of the fin 230). The drain semiconductor layer comprises one or more outer surfaces not positioned adjacent to the surface 208 of the substrate 216. A drain contact layer (not shown in FIG. 2A) is located on at least a portion of the outer surfaces of the drain semiconductor layer along at least a portion of a length of the drain semiconductor region. A TMD monolayer (not shown in FIG. 2A) is positioned between the drain semiconductor layer and the drain contact metal. The length 231 of the fin 230 and the length of the drain semiconductor layer extend in a same direction that is parallel to the surface 208 of the substrate 216. The drain semiconductor layer, drain contact metal, and the TMD monolayer between the drain contact layer and the drain contact metal of the FinFET 220 are not shown in FIGS. 2A-2C but are similar to their illustrated source counterparts (source semiconductor layer 225, source contact metal 217, TMD monolayer 219).

As will be discussed in greater detail below, the TMD monolayers in the FinFET source and drain contacts in FIG. 2A act to pin the Fermi levels of the interface between the source contact metal 117 and the source region 104 and the interface between the drain contact metal and the drain region 106.

The transistor 220 is non-planar in that the fin 230 extends from the surface 208 of the substrate 216. As the gate 222 encompasses three sides of the fin 230, the transistor 220 can be considered a tri-gate transistor. FIG. 2A illustrates one fin extending through the gate 222, but multiple fins can extend through the gate of a FinFET transistor. FIG. 2B is a cross-sectional view of the example FinFET 220 taken along the source region 235. Cross-section 240 illustrates the source contact metal 217 located on the source semiconductor layer 225, with the TMD monolayer 219 positioned between the source contact metal 217 and the source semiconductor layer 225.

As can be seen in FIG. 2B, the source contact metal 217 encompasses the outer surfaces 239. In such embodiments, the contact can be referred to as a wrap-around contact. FIG. 2C illustrates a cross-section of a variation of the FinFET 220 in which the source contact metal 217 is located on only a portion of the outer surfaces 239 of the source semiconductor layer 225. In cross-section 250, the source contact metal 217 is located on only two outer surfaces 239 of the source semiconductor layer 225 and the TMD monolayer 219 is positioned adjacent to only two outer surfaces 239. Although the extent of the TMD monolayer 219 illustrated in FIG. 2C is shown as being substantially aligned with that of the source contact metal 217, in other embodiments, the TMD monolayer 219 can extend further than the extent of the source contact metal 217 in a non-wrap-around-contact. For example, in some embodiments, the TMD monolayer 219 of FIG. 2C can encompass all of the outer surfaces 239 of the source semiconductor layer 225, as shown in FIG. 2B.

Although source semiconductor layer 225 is illustrated as having a pentagonal cross-sectional shape in FIGS. 2B-2C, the shape of source and drain semiconductor layers in FinFET contacts are not limited as such. In other embodiments, the cross-sectional shape of source and drain semiconductor regions in FinFET contacts can have a shape different from that illustrated in FIGS. 2B-2C.

The fin 230, the source semiconductor layer 225, and the drain semiconductor layer can comprise silicon, silicon and germanium, or another suitable semiconductor.

FIG. 3A is a perspective view of a GAAFET 340 comprising a gate 342, a source region 335, a drain region 337 and a semiconductor layer 330. The transistor 340 is formed on a substrate 316 comprising a surface 308, a bulk region 318, and isolation regions 314. The semiconductor layer 330 is located above and separate from the substrate 316 and is substantially parallel to the surface 308 of the substrate 316. The semiconductor layer 330 extends from a first end 332 of the semiconductor layer 330 to a second end 334 of the semiconductor layer. The gate 342 controls the flow of current through a channel region from the source portion 344 of the semiconductor layer 330 to a drain portion 346 of the semiconductor layer 330. The channel region is created by the gate 342 encompassing a portion of the semiconductor layer 330.

The source region 335 comprises the source portion 344 of the semiconductor layer 330 and a source semiconductor layer 325 (not shown in FIG. 3A) positioned adjacent to and encompassing at least a portion of the length 331 of the semiconductor layer 330 (the source portion 344 of the semiconductor layer 330). A source contact metal 317 (not shown in FIG. 3A) is located on and encompasses the source semiconductor layer 325 along at least a portion of a length of the source semiconductor layer 325. A TMD monolayer 319 is positioned between the source semiconductor layer 325 and the source contact metal 317. The length 331 of the semiconductor layer 330 and the length of the source semiconductor layer 325 extend in a same direction that is parallel to the surface 308 of the substrate 316.

The drain region 337 comprises a drain portion 346 of the semiconductor layer 330 and a drain semiconductor layer positioned adjacent to and encompassing at least a portion of the length 331 of the semiconductor layer 330 (the drain portion 346 of the semiconductor layer 300). A drain contact metal is located on and encompasses the drain semiconductor layer along at least a portion of a length of the drain semiconductor layer. A TMD monolayer is positioned between the drain semiconductor layer and the drain contact metal. The drain semiconductor layer, drain contact metal, and the TMD monolayer between the drain semiconductor layer and the drain contact metal of the GAAFET 340 are not shown in FIG. 3A but are similar to their illustrated source counterparts (source semiconductor layer 325, source contact metal 317, TMD monolayer 319). As will be discussed in greater detail below, the TMD monolayers of the source and drain contacts of the GAAFET 340 act to pin the Fermi levels of the interface between the source contact metal 317 and the source semiconductor layer 325 and the interface between the drain contact metal and the drain semiconductor layer.

A source isolation region 338 is positioned between the source contact metal 317 and the substrate 316 to isolate the source contact metal 317 from the substrate 316 and a drain isolation region (not shown in FIG. 3A) is positioned between the drain contact metal and the substrate 316 to isolate the drain contact metal from the substrate The transistor 340 is non-planar in that the semiconductor layer 330 is located above and is separate from the substrate 316. The transistor 340 is considered a gate-all-around transistor as the gate 342 encompasses all four sides of the semiconductor layer 330 along the portion of the length 331 of the semiconductor layer 330. FIG. 3B is a cross-sectional view of the GAAFET 340 taken along the source contact region. Cross-section 350 illustrates the TMD monolayer 319 positioned between the source contact metal 317 and the source semiconductor layer 325.

The GAAFET 340 can be alternatively referred to as a nanowire or a nanoribbon transistor, depending on a width 348 of the semiconductor layer 330 extending through the gate 342 relative to the thickness of the semiconductor layer 330. As the width 348 of the semiconductor layer 330 in FIG. 3B is greater than the thickness of the semiconductor layer 330, the GAAFET 340 can be referred to as a nanowire transistor. FIG. 3C shows a cross-section 360 of a version of the GAAFET 340 in which the width and thickness of the semiconductor layer 330 are similar. Accordingly, the version of the GAAFET 340 having the cross-section 360 can be referred to as a nanowire transistor.

Although source semiconductor layer 325 is illustrated as having a diamond cross-sectional shape in FIGS. 3A-3B the shape of source and drain semiconductor layers in GAAFET contacts are not limited as such. In other embodiments, the cross-section of source and drain regions semiconductor layers in GAAFET contacts can have a shape different from that illustrated in FIGS. 3B-3C.

The semiconductor layer 330, the source semiconductor layer 325 and the drain semiconductor layer can comprise silicon, silicon and germanium, or another suitable semiconductor.

Figures 4A, 4B, 4C, 5:
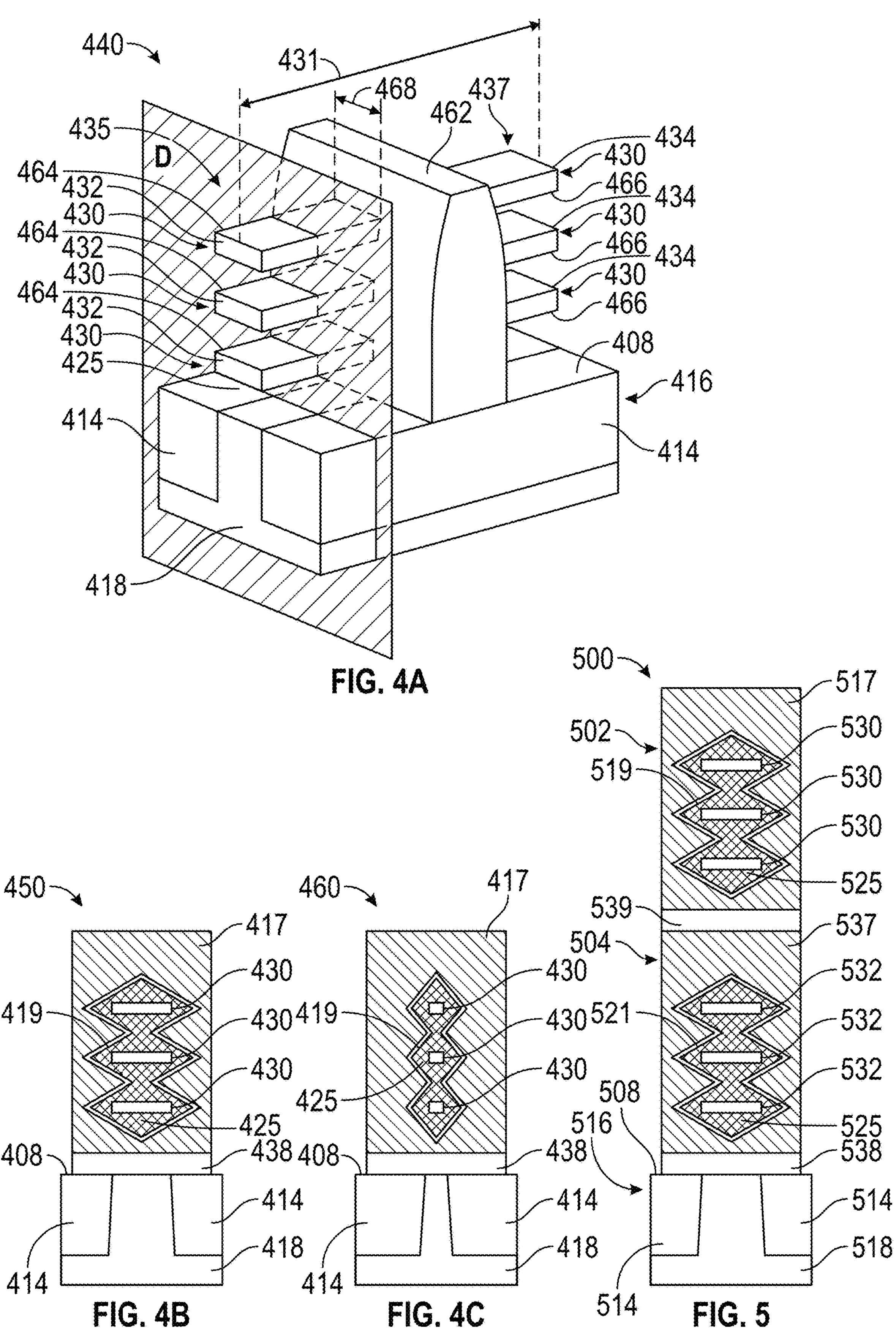
FIG. 4A is a simplified perspective view of an example stacked gate-all-around FET (GAAFET) comprising source/drain contacts with a transition metal dichalcogenide monolayer.
FIG. 4B is a cross-sectional view of the example stacked GAAFET of FIG. 4A taken along the source contact region.
FIG. 4C is a cross-sectional view of a variation of the example stacked GAAFET of FIG. 4A taken along the source contact region.
FIG. 5 is a cross-sectional view of a pair of example stacked GAAFETs stacked vertically.

FIG. 4A is a perspective view of a stacked GAAFET 440. The stacked GAAFET 440 is similar to the GAAFET 340 of FIG. 3A but with multiple semiconductor layers 430 located above the substrate. The transistor 440 is formed on a substrate 416 comprising a surface 408, a bulk region 418, and isolation regions 414. The stacked GAAFET 440 comprises a gate 462, a source region 435, and a drain region 437 and multiple semiconductor layers 430. The individual semiconductor layers 430 are substantially parallel to the surface 408 of the substrate 416 and extend along a length 431 from a first end 432 of the individual semiconductor layer 430 to a second end 434 of the individual semiconductor layer 430. The semiconductor layers 430 are stacked vertically with respect to the surface 408 of the substrate 416. The gate 462 controls the flow of current through multiple channel regions from source portions 464 of the semiconductor layers 430 to drain portions 466 of the semiconductor layers 430. The channel regions are formed by the gate 462 encompassing a portion of the semiconductor layers 430.

The source region 435 comprises the source portions 464 of the semiconductor layers 430 and a source semiconductor layer 425 is positioned adjacent to and encompasses at least a portion of the length 431 of the individual semiconductor layers 430 (the source portions 464 of the semiconductor layers 430). A source contact metal 417 is located on and encompasses the source semiconductor layer 425 along at least a portion of a length of the source semiconductor layer 425. A TMD monolayer 419 is positioned between the source semiconductor layer 425 and the source contact metal 417. The length 431 of the semiconductor layers 430 and the length of the source semiconductor layer 425 extend in a same direction that is parallel to the surface 408 of the substrate 416.

The drain region 437 comprises drain portions 466 of the semiconductor layers 430 and a drain semiconductor layer is positioned adjacent to and encompasses at least a portion of the length 431 of the individual semiconductor layers 430 (the drain portions 466 of the semiconductor layers 430). A drain contact metal is located on and encompasses the drain semiconductor layer along at least a portion of the length of the drain semiconductor layer. A TMD monolayer is positioned between the drain semiconductor layer and the drain contact metal. The drain semiconductor layer, drain contact metal, and the TMD monolayer between the drain contact layer and the drain contact metal of the stacked GAAFET 440 are not shown in FIG. 4A but are similar to their illustrated source counterparts (source semiconductor layer 425, source contact metal 417, TMD monolayer 419). As will be discussed in greater detail below, the TMD monolayers of the source and drain contacts of the GAAFET 440 act to pin the Fermi levels of the interface between the source contact metal 417 and the source semiconductor layer 425 and the interface between the drain contact metal and the drain semiconductor layer. The length 431 of the semiconductor layers 430 and the length of the drain semiconductor layer extend in a same direction that is parallel to the surface 408 of the substrate 416. A source isolation region 438 is positioned between the source contact metal 417 and the substrate 416 to isolate the source contact metal 417 from the substrate 416.

FIG. 4B is a cross-sectional view of the example stacked GAAFET 440 taken along the source contact region. Cross-section 450 illustrates the TMD monolayer 419 positioned between the source contact metal 417 and the source semiconductor layer 425. FIG. 4C shows a cross-section 460 of a version of the GAAFET 440 in which the width (e.g., width 468) and thickness of the semiconductor layers 430 are similar. Accordingly, the version of the GAAFET 440 having the cross-section 460 can be referred to as a nanowire transistor.

Although source semiconductor layer 425 is illustrated as having a stacked diamond cross-sectional shape in FIGS. 4B-4C, the shape of source and drain semiconductor regions in a stacked GAAFET are not limited as such. In other embodiments, the cross-sectional shape of source and drain semiconductor layers in a stacked GAAFET can have a shape different than that illustrated in FIGS. 4B-4C.

The semiconductor layers 430, the source semiconductor layer 425 and the drain semiconductor layer can comprise silicon, silicon and germanium, or another suitable semiconductor.

FIG. 5 is a cross-sectional view of an example pair of stacked GAAFETs stacked vertically. Cross-section 500 is a cross-sectional view of a source contact region of a first stacked GAAFET 502 located above a source contact region of a second stacked GAAFET 504. The GAAFETs 502 and 504 are located above a substrate 516 that comprises a surface 508, a bulk region 518 and isolating regions 514. The first GAAFET 502 comprises semiconductor layers 530 encompassed by a source semiconductor layer 525. A TMD monolayer 519 encompasses the source semiconductor layer 525 and a source contact metal 517 is located on and encompasses the source semiconductor layer 525. The second GAAFET 504 comprises source semiconductor layers 532 encompassed by a source semiconductor layer 527. A TMD monolayer 521 encompasses the source semiconductor layer 527 and a source contact metal 537 is located on and encompasses the source semiconductor layer 527. An isolation region 538 is positioned between the source contact metal 537 of the second GAAFET 504 and the substrate 516 and an isolation region 539 is positioned between the source contact metals 517 and 537 of the first and second GAAFETs 502 and 504, respectively. In some embodiments, one of the GAAFETs 502 and 504 can be an n-type transistor and the other of the GAAFETs 502 and 504 can be a p-type transistor. In some embodiments, the GAAFETs 502 and 504 can be transistors belonging to the same logic gate (e.g., NAND gate, NOR gate) or to different logic gates.

The TMD monolayers described herein act to pin the Fermi level of a contact metal-semiconductor interface at which a TMD monolayer is located. That is, the Fermi level of the metal-semiconductor interface can be determined by the TMD monolayer and not the contact metal. For example, experimental results indicate that a monolayer of molybdenum disulfide ($MoS_2$, a material comprising molybdenum and sulfur) can pin the Fermi level of a metal-semiconductor interface at about 4.48 eV and a monolayer of molybdenum telluride ($MoTe_2$) can pin the interface Fermi level of a metal-semiconductor interface at about 4.77 eV. The Fermi level of a metal-semiconductor interface can be tuned (or adjusted) through the selection of the TMD used for the monolayer. TMDs have the chemical formula $MX_2$ where M is a transition metal and X is sulfur, selenium, or tellurium. A transition metal dichalcogenide monolayer comprises a middle layer of M atoms sandwiched between two layers of X atoms. In some embodiments, the monolayers disclosed herein are a transition metal dichalcogenide with titanium, molybdenum, tungsten, platinum, erbium, lanthanum, and rhodium as the transition metal. That is, in some embodiments, the TMD monolayer can be molybdenum disulfide ($MoS_2$), molybdenum diselenide ($MoSe_2$), molybdenum ditelluride ($MoTe_2$), titanium disulfide ($TiS_2$), titanium diselenide ($TiSe_2$), titanium ditelluride ($TiTe_2$), tungsten disulfide (WS2), tungsten diselenide ($WSe_2$), tungsten ditelluride ($WTe_2$), platinum disulfide ($PtS_2$), platinum diselenide ($PtSe_2$), platinum ditelluride ($PtTe_2$), erbium disulfide ($ErS_2$), erbium diselenide ($ErSe_2$), erbium ditelluride ($ErTe_2$), rhodium disulfide ($RhS_2$), rhodium diselenide ($RhSe_2$), rhodium ditelluride ($RhTe_2$), lanthanum disulfide ($LaS_2$), lanthanum diselenide ($LaSe_2$), or lanthanum ditelluride ($LaTe_2$).

Through the selection of an appropriate TMD monolayer material for a particular contact metal, the Schottky barrier height of a contact metal-semiconductor interface with a TMD monolayer can be reduced relative to a contact metal-semiconductor without a TMD monolayer. In general, TMD monolayers that pin the interface Fermi level to lower values can lower the Schottky barrier height for electrons at a contact metal interface to an n-type semiconductor region (such as n-type source/drain regions). For example, TMD monolayers that pin the Fermi level to a value near that of the conduction band energy level of a silicon source/drain region (e.g., 4.2-4.4 eV) are advantageous for use in an interface between a contact metal and an n-type silicon source/drain region. In some embodiments, TMD monolayers with erbium, lanthanum, and titanium as the transition metal are used in metal contacts to an n-type silicon source/drain region. TMD monolayers that pin the interface Fermi level at higher values can lower the Schottky barrier height for holes at a contact metal interface to a p-type semiconductor region, such as p-type source/drain regions. For example, TMD monolayers that pin the Fermi level to a value of approximately 5.1 eV (or greater) can be advantageous for use in an interface between a contact metal and a p-type silicon source/drain region. In some embodiments, TMD monolayers with platinum or rhodium as the transition metal are used in metal contacts to a p-type silicon source/drain region.

Figures 6A, 6B, 6C, 6D, 6E:
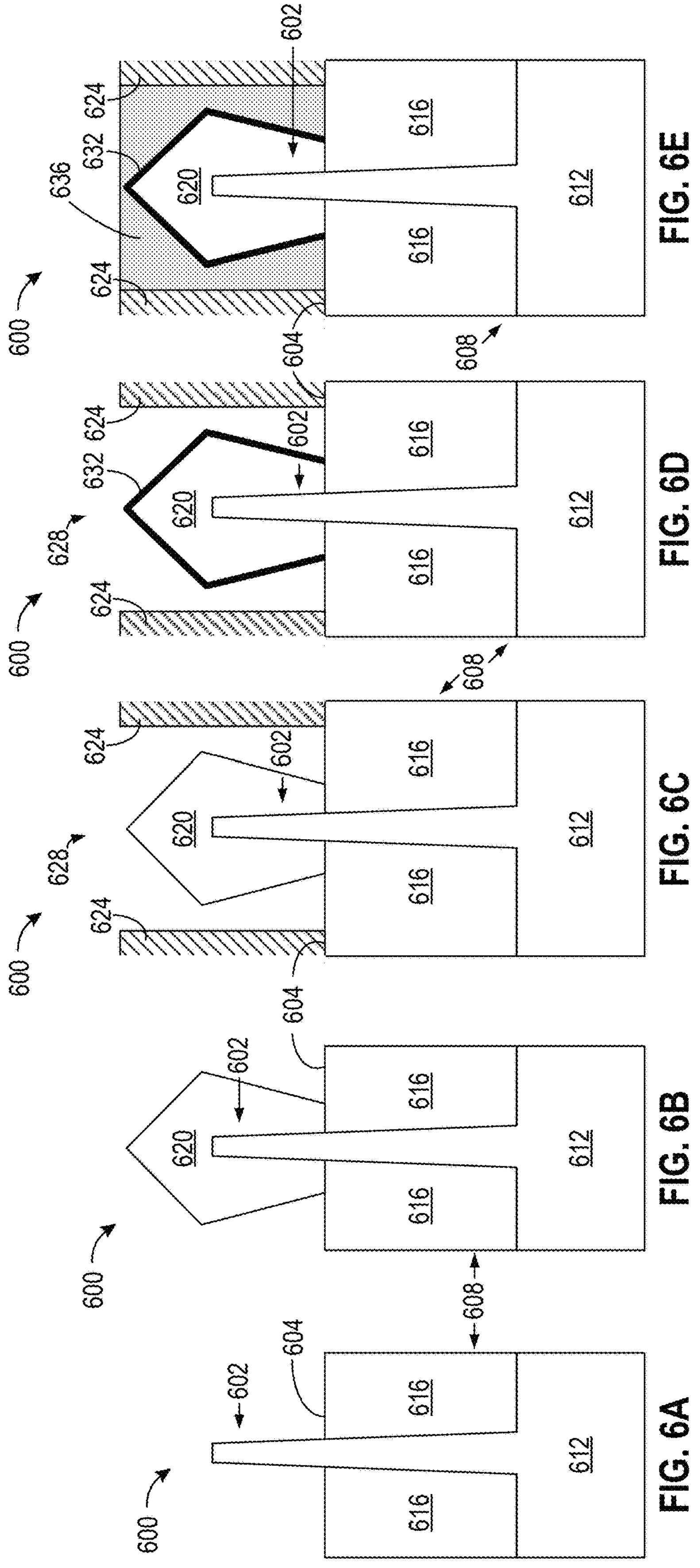
FIGS. 6A-6E illustrate an example simplified process sequence for forming a FinFET source/drain metal contact comprising a TMD monolayer.

FIGS. 6A-6E illustrate an example simplified process sequence for forming a FinFET source/drain metal contact comprising a TMD monolayer. FIG. 6A illustrates a structure 600 comprising a fin 602 extending from a surface 604 of a substrate 608 comprising a bulk substrate region 612 and isolation regions 616. The fin 602 can comprise silicon, silicon and germanium, or another suitable semiconductor and can comprise one or more n-type dopants or one or more p-type dopants. FIG. 6B illustrates the structure 600 after formation of an epitaxially-grown semiconductor layer 620 positioned adjacent to the fin 602. The semiconductor layer 620 can be epitaxially grown with in situ doping of one or more n-type dopants or one or more p-type dopants. FIG. 6C illustrates the structure 600 after formation of a dielectric layer 624 and etching of the dielectric layer 624 to form a contact opening 628. FIG. 6D illustrates the structure 600 after formation of a TMD monolayer 632. In some embodiments, the TMD monolayer can be grown by formation (e.g., deposition) of a monolayer of a transition metal and then performing a selenization, sulfurization, or tellurization process to transform the transition metal monolayer to a TMD monolayer. For example, to form a monolayer of molybdenum disulfide ($MoS_2$), a monolayer of molybdenum can first be formed and the monolayer of molybdenum can then be sulfurized. FIG. 6E illustrates the structure 600 after filling the contact hole 628 to create the contact metal layer 636.

Transition metal dichalcogenide monolayers can be selectively formed at contact metal-semiconductor interfaces during fabrication of an integrated circuit component. That is, transition metal dichalcogenide monolayers can be formed on selected semiconductor regions in an integrated circuit component while a transition metal dichalcogenide monolayer is not formed on other semiconductor regions. In one example of selective formation of transition metal dichalcogenide monolayers within an integrated circuit component, molybdenum contacts are to be formed to contact to the source/drain regions of NMOS and PMOS transistors. But, as molybdenum has a work function of 5.0 eV (a relatively high metal work function), a monolayer of molybdenum disulfide is desired to be formed only on the n-type source/drain contacts to lower the contact resistance. In the example, no molybdenum disulfide monolayers are formed at the p-type source/drain regions as the higher work function of molybdenum can be preferable at interfaces between the contact metals and p-type semiconductors.

In a selective TMD monolayer formation process, a molybdenum monolayer can be formed on n-type and p-type source/drain semiconductor regions. Using a photolithograph and etching process, a mask can be formed over the p-type source/drain regions after formation of the molybdenum monolayer, with the molybdenum monolayers formed on the n-type source/drain regions being exposed. In a sulfurization step, the exposed molybdenum monolayers can be sulfurized to form a monolayer of molybdenum disulfide ($MoS_2$) over the n-type source/drain regions. The molybdenum monolayers formed on the p-type source/drain regions are protected from the sulfurization step. After removal of the mask, a subsequent molybdenum metal fill step can be performed with the result being bulk molybdenum layers formed on molybdenum monolayers located on the p-type source/drain regions and on the molybdenum disulfide monolayers located on the n-type source/drain regions.

Selecting processing further allows for different transition metal dichalcogenide monolayers can be formed on different semiconductor regions. For example, a first transition metal dichalcogenide monolayer can be formed on a first set of semiconductor regions using a first photolithography and etch process and a second set of transition metal dichalcogenide monolayers can be formed at a second set of semiconductor regions using a second photolithography and etch process.

The various layers, regions, contacts, transistors, and other structures described or referenced herein can comprise various materials as follows. A substrate that a contact comprising a TMD monolayer is located on or above the substrate (e.g., substrate 116, 216, 316, 416, 516) can comprise silicon and be, for example, a bulk silicon substrate, a silicon-on-insulator substrate, or another suitable substrate. A fin (e.g., 230, 602) of a FinFET or any of the semiconductor layers (e.g., 330, 430, 530, 532) positioned above the substrate and forming the channel regions of a GAAFET (GAAFET semiconductor layer) can comprise silicon, silicon and germanium, or another suitable semiconductor. The portions of a fin in a p-type source semiconductor layer (e.g., 235) or a p-type drain semiconductor layer of a FinFET can comprise silicon germanium. The portions of a GAAFET semiconductor layer in a p-type source region (e.g., 335) or a p-type drain region (e.g., 337) of a GAAFET can comprise silicon and germanium as well. A fin or a GAAFET semiconductor layer can comprise one or more n-type dopants, such as phosphorous, arsenic, or antimony or another suitable n-type dopant, or one or more p-type dopants, such as boron, gallium, indium, or another suitable p-type dopant. A fin or GAAFET semiconductor layer can comprise one or more different n-type or p-type dopants in different portions of the fin or GAAFET semiconductor layer. For example, the channel region of a fin or GAAFET semiconductor layer can comprise one or more different dopants than portions of the fin or GAAFET semiconductor layer in the source and drain regions of a FinFET or GAAFET.

The source semiconductor layer (225, 325, 425, 525, 620) and drain semiconductor layer positioned adjacent to a fin or a GAAFET semiconductor layer can comprise silicon, silicon and germanium, or another suitable semiconductor. A source semiconductor layer (225, 325, 425, 525, 620) and drain semiconductor layer can comprise one or more n-type dopants, such as phosphorous, arsenic, or antimony or another suitable n-type dopant, or one or more p-type dopants, such as boron, gallium, indium, or another suitable p-type dopant. In some embodiments, the source semiconductor layer and the drain semiconductor layer can be epitaxially grown. The n-type dopants or p-dopants can be introduced via in situ doping in epitaxially grown source or drain semiconductor layers.

A source contact metal (e.g., 117, 217, 317, 417, 517, 537, 636) or a drain contact metal can comprise one or more of tungsten, cobalt, titanium, gold, aluminum, molybdenum, chromium, and nickel, or another suitable metal or alloy. The substrate isolation regions (e.g., 114, 214, 314, 414, 514, 616) can comprise silicon dioxide ($SiO_2$, a material comprising silicon and oxide) or any other suitable oxide, nitride, or any other material suitable for providing electrical isolation between adjacent transistors.

The isolation regions isolating source contact metals or drain contact metals from the substrate or other contact metals can be a suitable nitride or oxide, such as silicon dioxide ($SiO_2$), carbon-doped (C-doped) silicon dioxide (C-doped $SiO_2$, also known as CDO or organosilicate glass, which is a material that comprises silicon, oxygen, and carbon), fluorine-doped silicon dioxide (F-doped $SiO_2$, also known as fluorosilicate glass, which is a material that comprises fluorine, silicon, and oxygen), hydrogen-doped silicon dioxide (H-doped $SiO_2$, which is a material that comprises silicon, oxygen, and hydrogen), or silicon nitride ($Si_3N_4$, which is a material that comprises silicon and nitrogen).

In some embodiments, one or more barrier layers can be positioned between a source contact metal or a drain contact metal to a semiconductor to limit the amount of metal that diffuses from the contact metal layer to a TMD monolayer or the semiconductor layer or region. A barrier layer can comprise cobalt (Co), ruthenium (Ru), tantalum (Ta), tantalum nitride (which is a material comprising titanium and nitrogen (e.g., TaN, $Ta_2N$, $Ta_3N_5$)), indium oxide ($In_2O_3$, which is a material that comprises indium and oxygen), tungsten nitride (which is a material that comprises tungsten and nitrogen (e.g., $W_2N$, WN, $WN_2$), and titanium nitride (TiN, which is a material that comprises titanium and nitrogen) or another suitable material.

The contacts described herein can be used in any processor unit, integrated circuit component, or computing system described or referenced herein. The contacts can be fabricated as part of an integrated circuit structure. The integrated circuit structure can comprise a die substrate, such as a die substrate comprising silicon, and one or more interconnect or metal layers. The contact can connect to a line of an interconnect or metal layer by a via or by being positioned adjacent to a line of a metal layer. The integrated circuit structure can comprise other types of devices, such as electronic transistors (transistors such as CMOS transistors that operate through control of the flow of electric current and that do not rely upon the switching of the magnetization of a layer or component for operation) and/or magnetoelectric spin-orbit (MESO) devices that use magnetoelectric switching to convert an input voltage/charge into a magnetic spin state (e.g., charge-to-spin conversion) and further uses spin-orbit transduction to convert the magnetic spin state back into an output charge/voltage (e.g., spin-to-charge conversion). An integrated circuit component comprising any of the contacts with TMD monolayers described herein can be attached to a printed circuit board. In some embodiments, one or more additional integrated circuit components can be attached to the circuit board. In some embodiments, the printed circuit board and the integrated circuit component can be located in a computing device that comprises a housing that encloses the printed circuit board and the integrated circuit component.

Figure 7:
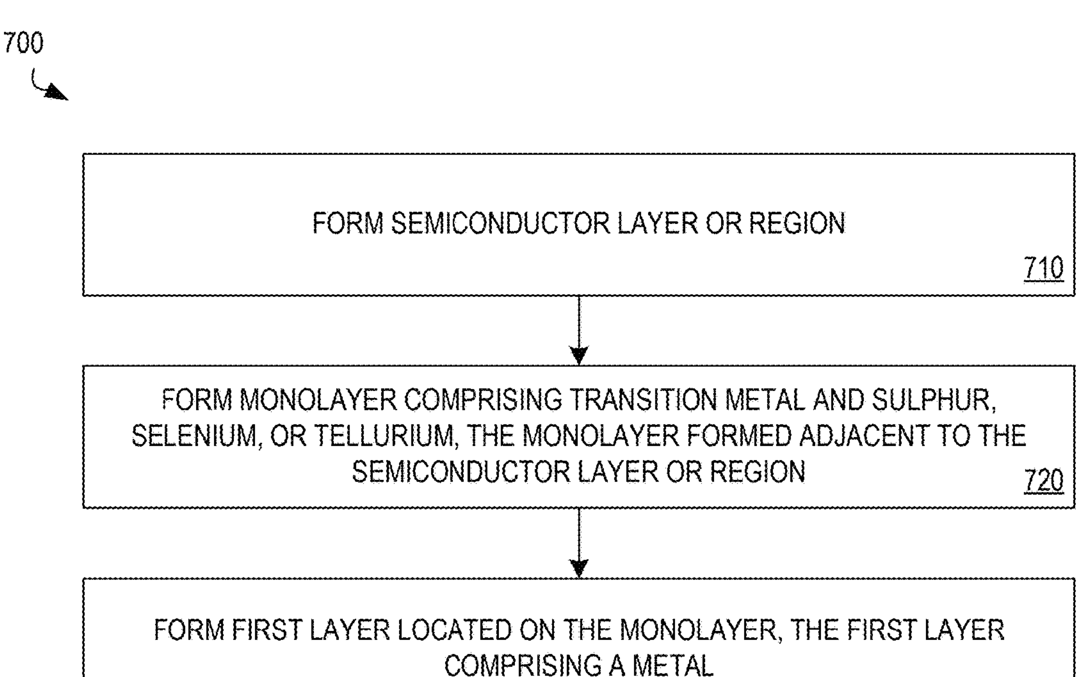
FIG. 7 is an example method of forming a metal contact to a semiconductor comprising a transition metal dichalcogenide.

FIG. 7 is an example method of forming a metal contact to a semiconductor comprising a transition metal dichalcogenide monolayer. At 710 in the method 700, a semiconductor layer or region is formed. At 720, a monolayer comprising a transition metal and sulfur, selenium, or tellurium is formed, the monolayer formed adjacent to the semiconductor layer or region. At 730, a first layer is formed. The first layer is located on the monolayer, the first layer comprising a metal.

In some embodiments, the method 700 can comprise additional elements. For example, the method 700 can further comprise forming a fin prior to forming the semiconductor layer or region, the fin extending from a surface of a substrate, the semiconductor layer or region positioned adjacent to and encompassing at least a portion of a length of the fin, the semiconductor layer or region comprising one or more outer surfaces not positioned adjacent to the surface of a substrate, the first layer located on and encompassing the one or more outer surface along at least a portion of a length of the semiconductor layer or region, the length of the semiconductor layer or region layer and the length of the fin extending a same direction that is parallel to the surface of the substrate, the fin comprising silicon.

In another example, further comprising forming one or more second layers located above and separate from a substrate, the semiconductor layer or region positioned adjacent to and encompassing at a least a portion of individual of the one or more second layers, the first layer located on and encompassing at least a portion of a length of the semiconductor layer or region, the length of the first layer and the length of the individual one or more second layers extending a same direction that is parallel to the surface of the substrate, the one or more second layers comprising silicon.

Figure 8:
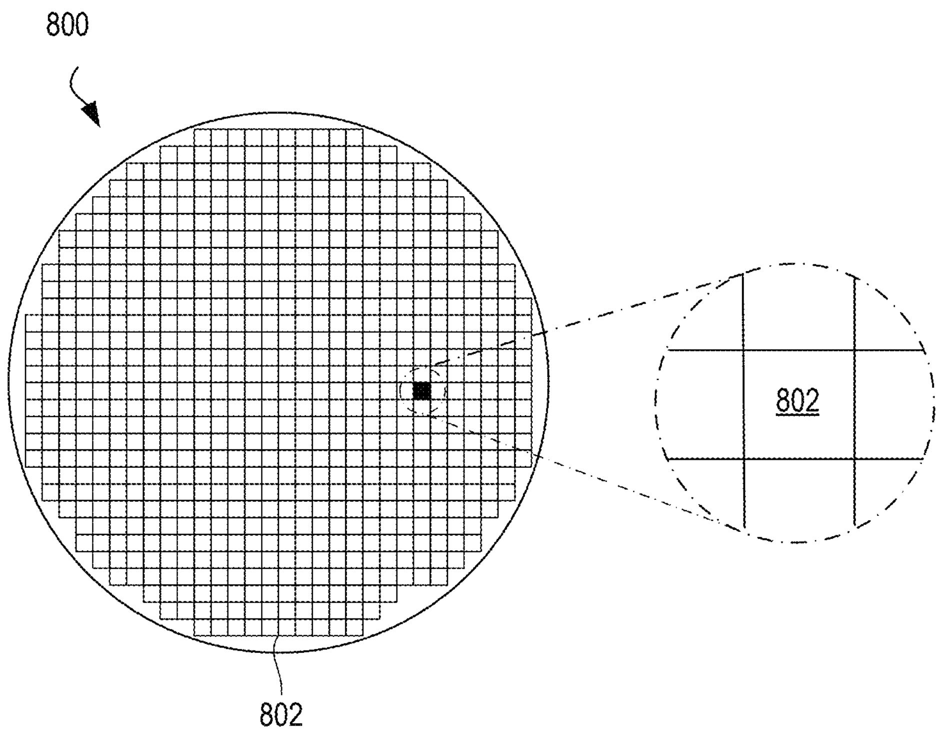
FIG. 8 is a top view of a wafer and dies that may be included in a microelectronic assembly, in accordance with any of the embodiments disclosed herein.

FIG. 8 is a top view of a wafer 800 and dies 802 that may be included in any of the integrated circuit components disclosed herein. The wafer 800 may be composed of semiconductor material and may include one or more dies 802 having integrated circuit structures formed on a surface of the wafer 800. The individual dies 802 may be a repeating unit of an integrated circuit product that includes any suitable integrated circuit. After the fabrication of the semiconductor product is complete, the wafer 800 may undergo a singulation process in which the dies 802 are separated from one another to provide discrete "chips" of the integrated circuit product. The die 802 may include one or more transistors (e.g., some of the transistors 940 of FIG. 9, discussed below), supporting circuitry to route electrical signals to the transistors, passive components (e.g., signal traces, resistors, capacitors, or inductors), and/or any other integrated circuit components. In some embodiments, the wafer 800 or the die 802 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 802. For example, a memory array formed by multiple memory devices may be formed on a same die 802 as a processor unit (e.g., the processor unit 1102 of FIG. 11) or other logic that is configured to store information in the memory devices or execute instructions stored in the memory array. Various ones of the microelectronic assemblies disclosed herein may be manufactured using a die-to-wafer assembly technique in which some dies 802 are attached to a wafer 800 that include others of the dies 802, and the wafer 800 is subsequently singulated.

Figure 9:
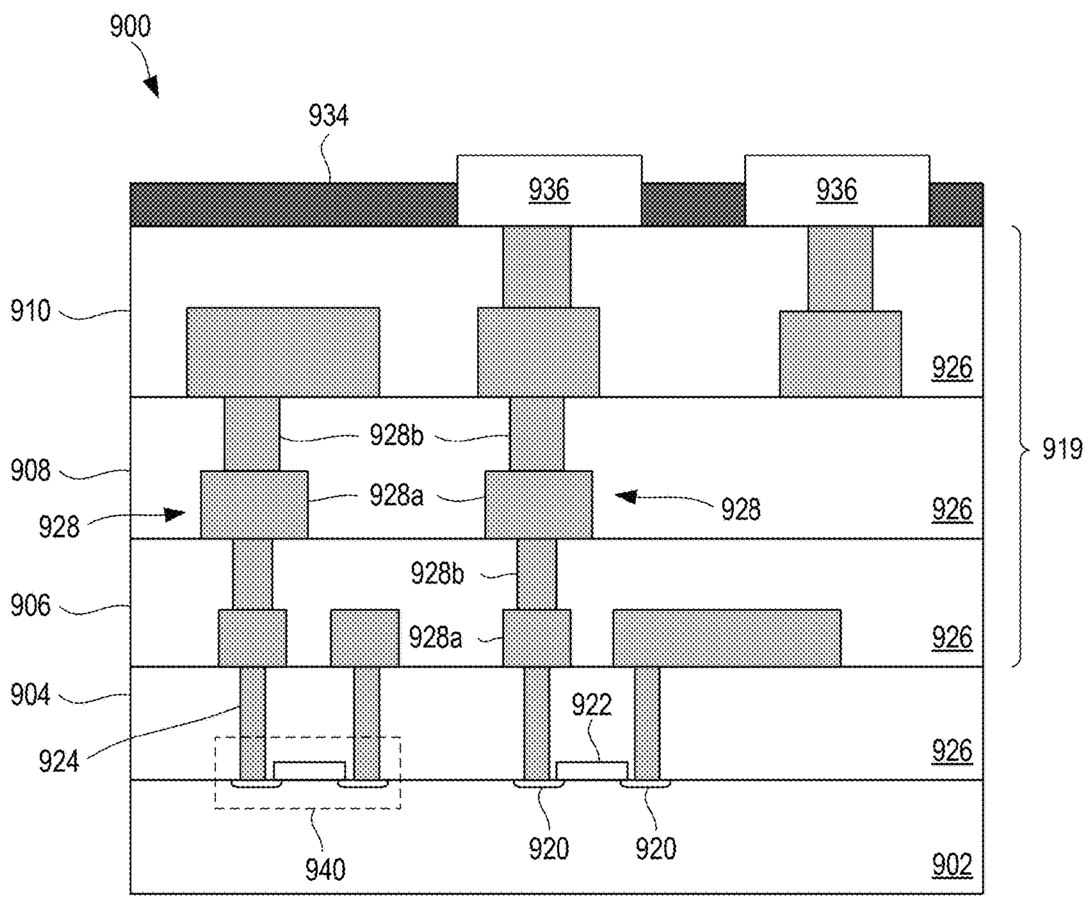
FIG. 9 is a cross-sectional side view of an integrated circuit device that may be included in a microelectronic assembly, in accordance with any of the embodiments disclosed herein.

FIG. 9 is a cross-sectional side view of an integrated circuit device 900 that may be included in any of the microelectronic assemblies or integrated circuit components disclosed herein. One or more of the integrated circuit devices 900 may be included in one or more dies 802 (FIG. 8). The integrated circuit device 900 may be formed on a die substrate 902 (e.g., the wafer 800 of FIG. 8) and may be included in a die (e.g., the die 802 of FIG. 8). The die substrate 902 may be a semiconductor substrate composed of semiconductor material systems including, for example, n-type or p-type materials systems (or a combination of both). The die substrate 902 may include, for example, a crystalline substrate formed using a bulk silicon or a silicon-on-insulator (SOI) substructure. In some embodiments, the die substrate 902 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 902. Although a few examples of materials from which the die substrate 902 may be formed are described here, any material that may serve as a foundation for an integrated circuit device 900 may be used. The die substrate 902 may be part of a singulated die (e.g., the dies 802 of FIG. 8) or a wafer (e.g., the wafer 800 of FIG. 8).

The integrated circuit device 900 may include one or more device layers 904 disposed on the die substrate 902. The device layer 904 may include features of one or more transistors 940 (e.g., metal oxide semiconductor field-effect transistors (MOSFETs)) formed on the die substrate 902. The transistors 940 may include, for example, one or more source and/or drain (S/D) regions 920, a gate 922 to control current flow between the S/D regions 920, and one or more S/D contacts 924 to route electrical signals to/from the S/D regions 920. The S/D contacts 924 can comprise any of the contacts comprising a transition metal dichalcogenide monolayer described herein. The transistors 940 may include additional features not depicted for the sake of clarity, such as device isolation regions, gate contacts, and the like. The transistors 940 are not limited to the type and configuration depicted in FIG. 9 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors. FIGS. 1A, 2A, 3A, and 4A are simplified perspective views of example planar, FinFET, gate-all-around and stacked all-around transistors, respectively and are described in greater detail above.

A transistor 940 may include a gate 922 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 940 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 940 along the source-channel-drain direction, the gate electrode may consist of a U-shaped structure that includes a bottom portion substantially parallel to the surface of the die substrate 902 and two sidewall portions that are substantially perpendicular to the top surface of the die substrate 902. In other embodiments, at least one of the metal layers that form the gate electrode may simply be a planar layer that is substantially parallel to the top surface of the die substrate 902 and does not include sidewall portions substantially perpendicular to the top surface of the die substrate 902. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 920 may be formed within the die substrate 902 adjacent to the gate 922 of individual transistors 940. The S/D regions 920 may be formed using an implantation/diffusion process or an etching/deposition process, for example. In the former process, dopants such as boron, aluminum, antimony, phosphorous, or arsenic may be ion-implanted into the die substrate 902 to form the S/D regions 920. An annealing process that activates the dopants and causes them to diffuse farther into the die substrate 902 may follow the ion-implantation process. In the latter process, the die substrate 902 may first be etched to form recesses at the locations of the S/D regions 920. An epitaxial deposition process may then be carried out to fill the recesses with material that is used to fabricate the S/D regions 920. In some implementations, the S/D regions 920 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 920 may be formed using one or more alternate semiconductor materials such as germanium or a group III-V material or alloy. In further embodiments, one or more layers of metal and/or metal alloys may be used to form the S/D regions 920.

Electrical signals, such as power and/or input/output (I/O) signals, may be routed to and/or from the devices (e.g., transistors 940) of the device layer 904 through one or more interconnect layers disposed on the device layer 904 (illustrated in FIG. 9 as interconnect layers 906-910). For example, electrically conductive features of the device layer 904 (e.g., the gate 922 and the S/D contacts 924) may be electrically coupled with the interconnect structures 928 of the interconnect layers 906-910. The one or more interconnect layers 906-910 may form a metallization stack (also referred to as an “ILD stack”) 919 of the integrated circuit device 900.

The interconnect structures 928 may be arranged within the interconnect layers 906-910 to route electrical signals according to a wide variety of designs; in particular, the arrangement is not limited to the particular configuration of interconnect structures 928 depicted in FIG. 9. Although a particular number of interconnect layers 906-910 is depicted in FIG. 9, embodiments of the present disclosure include integrated circuit devices having more or fewer interconnect layers than depicted.

In some embodiments, the interconnect structures 928 may include lines **928*a* and/or vias 928*b* filled with an electrically conductive material such as a metal. The lines 928*a* may be arranged to route electrical signals in a direction of a plane that is substantially parallel with a surface of the die substrate 902 upon which the device layer 904 is formed. For example, the lines 928*a* may route electrical signals in a direction in and out of the page and/or in a direction across the page from the perspective of FIG. 11. The vias 928*b* may be arranged to route electrical signals in a direction of a plane that is substantially perpendicular to the surface of the die substrate 902 upon which the device layer 904 is formed. In some embodiments, the vias 928*b* may electrically couple lines 928*a* of different interconnect layers 906-910** together.

The interconnect layers 906-910 may include a dielectric material 926 disposed between the interconnect structures 928, as shown in FIG. 9. In some embodiments, dielectric material 926 disposed between the interconnect structures 928 in different ones of the interconnect layers 906-910 may have different compositions; in other embodiments, the composition of the dielectric material 926 between different interconnect layers 906-910 may be the same. The device layer 904 may include a dielectric material 926 disposed between the transistors 940 and a bottom layer of the metallization stack as well. The dielectric material 926 included in the device layer 904 may have a different composition than the dielectric material 926 included in the interconnect layers 906-910; in other embodiments, the composition of the dielectric material 926 in the device layer 904 may be the same as a dielectric material 926 included in any one of the interconnect layers 906-910.

A first interconnect layer 906 (referred to as Metal 1 or "M1") may be formed directly on the device layer 904. In some embodiments, the first interconnect layer 906 may include lines 928a and/or vias 928b, as shown. The lines 928a of the first interconnect layer 906 may be coupled with contacts (e.g., the S/D contacts 924) of the device layer 904. The vias 928b of the first interconnect layer 906 may be coupled with the lines 928a of a second interconnect layer 908.

The second interconnect layer 908 (referred to as Metal 2 or "M2") may be formed directly on the first interconnect layer 906. In some embodiments, the second interconnect layer 908 may include via 928b to couple the lines 928 of the second interconnect layer 908 with the lines 928a of a third interconnect layer 910. Although the lines 928a and the vias 928b are structurally delineated with a line within individual interconnect layers for the sake of clarity, the lines 928a and the vias 928b may be structurally and/or materially contiguous (e.g., simultaneously filled during a dual-damascene process) in some embodiments.

The third interconnect layer 910 (referred to as Metal 3 or "M3") (and additional interconnect layers, as desired) may be formed in succession on the second interconnect layer 908 according to similar techniques and configurations described in connection with the second interconnect layer 908 or the first interconnect layer 906. In some embodiments, the interconnect layers that are "higher up" in the metallization stack 919 in the integrated circuit device 900 (i.e., farther away from the device layer 904) may be thicker that the interconnect layers that are lower in the metallization stack 919, with lines 928a and vias 928b in the higher interconnect layers being thicker than those in the lower interconnect layers.

The integrated circuit device 900 may include a solder resist material 934 (e.g., polyimide or similar material) and one or more conductive contacts 936 formed on the interconnect layers 906-910. In FIG. 9, the conductive contacts 936 are illustrated as taking the form of bond pads. The conductive contacts 936 may be electrically coupled with the interconnect structures 928 and configured to route the electrical signals of the transistor(s) 940 to external devices. For example, solder bonds may be formed on the one or more conductive contacts 936 to mechanically and/or electrically couple an integrated circuit die including the integrated circuit device 900 with another component (e.g., a printed circuit board). The integrated circuit device 900 may include additional or alternate structures to route the electrical signals from the interconnect layers 906-910; for example, the conductive contacts 936 may include other analogous features (e.g., posts) that route the electrical signals to external components.

In some embodiments in which the integrated circuit device 900 is a double-sided die, the integrated circuit device 900 may include another metallization stack (not shown) on the opposite side of the device layer(s) 904. This metallization stack may include multiple interconnect layers as discussed above with reference to the interconnect layers 906-910, to provide conductive pathways (e.g., including conductive lines and vias) between the device layer(s) 904 and additional conductive contacts (not shown) on the opposite side of the integrated circuit device 900 from the conductive contacts 936.

In other embodiments in which the integrated circuit device 900 is a double-sided die, the integrated circuit device 900 may include one or more through silicon vias (TSVs) through the die substrate 902; these TSVs may make contact with the device layer(s) 904, and may provide conductive pathways between the device layer(s) 904 and additional conductive contacts (not shown) on the opposite side of the integrated circuit device 900 from the conductive contacts 936. In some embodiments, TSVs extending through the substrate can be used for routing power and ground signals from conductive contacts on the opposite side of the integrated circuit device 900 from the conductive contacts 936 to the transistors 940 and any other components integrated into the die 900, and the metallization stack 919 can be used to route I/O signals from the conductive contacts 936 to transistors 940 and any other components integrated into the die 900.

Multiple integrated circuit devices 900 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fin-pitch solder bumps (microbumps).

Figure 10:
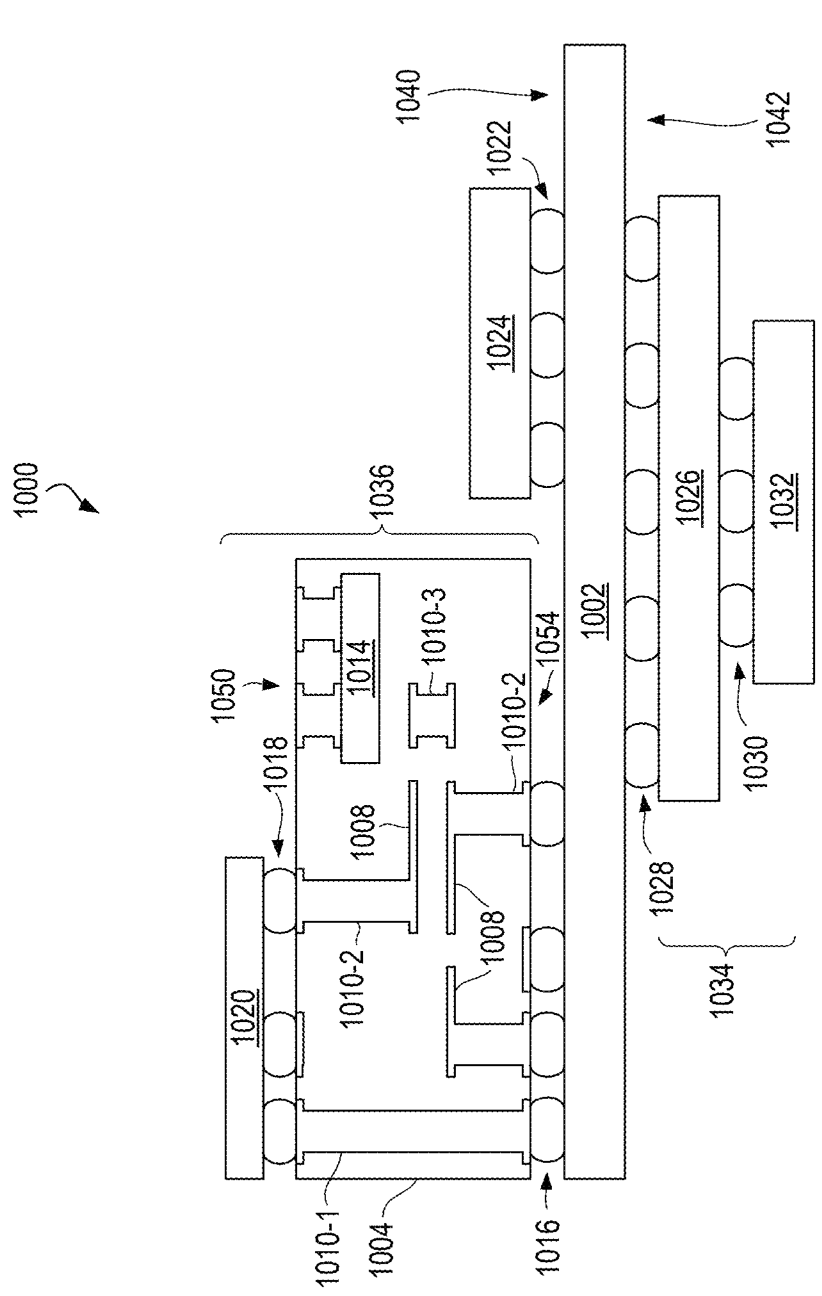
FIG. 10 is a cross-sectional side view of an integrated circuit device assembly that may include a microelectronic assembly, in accordance with any of the embodiments disclosed herein.

FIG. 10 is a cross-sectional side view of an integrated circuit device assembly 1000 that may include any of the microelectronic assemblies disclosed herein. The integrated circuit device assembly 1000 includes a number of components disposed on a circuit board 1002 (which may be a motherboard, system board, mainboard, etc.). The integrated circuit device assembly 1000 includes components disposed on a first face 1040 of the circuit board 1002 and an opposing second face 1042 of the circuit board 1002; generally, components may be disposed on one or both faces 1040 and 1042. Any of the integrated circuit components discussed below with reference to the integrated circuit device assembly 1000 may take the form of any suitable ones of the embodiments of the microelectronic assemblies disclosed herein.

In some embodiments, the circuit board 1002 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 1002. In other embodiments, the circuit board 1002 may be a non-PCB substrate. The integrated circuit device assembly 1000 illustrated in FIG. 10 includes a package-on-interposer structure 1036 coupled to the first face 1040 of the circuit board 1002 by coupling components 1016. The coupling components 1016 may electrically and mechanically couple the package-on-interposer structure 1036 to the circuit board 1002, and may include solder balls (as shown in FIG. 10), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 1036 may include an integrated circuit component 1020 coupled to an interposer 1004 by coupling components 1018. The coupling components 1018 may take any suitable form for the application, such as the forms discussed above with reference to the coupling components 1016. Although a single integrated circuit component 1020 is shown in FIG. 10, multiple integrated circuit components may be coupled to the interposer 1004; indeed, additional interposers may be coupled to the interposer 1004. The interposer 1004 may provide an intervening substrate used to bridge the circuit board 1002 and the integrated circuit component 1020.

The integrated circuit component 1020 may be a packaged or unpacked integrated circuit product that includes one or more integrated circuit dies (e.g., the die 802 of FIG. 8, the integrated circuit device 900 of FIG. 9) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 1020, a single monolithic integrated circuit die comprises solder bumps attached to contacts on the die. The solder bumps allow the die to be directly attached to the interposer 1004. The integrated circuit component 1020 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 1020 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 1020 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 1020 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 1004 may spread connections to a wider pitch or reroute a connection to a different connection. For example, the interposer 1004 may couple the integrated circuit component 1020 to a set of ball grid array (BGA) conductive contacts of the coupling components 1016 for coupling to the circuit board 1002. In the embodiment illustrated in FIG. 10, the integrated circuit component 1020 and the circuit board 1002 are attached to opposing sides of the interposer 1004; in other embodiments, the integrated circuit component 1020 and the circuit board 1002 may be attached to a same side of the interposer 1004. In some embodiments, three or more components may be interconnected by way of the interposer 1004.

In some embodiments, the interposer 1004 may be formed as a PCB, including multiple metal layers separated from one another by layers of dielectric material and interconnected by electrically conductive vias. In some embodiments, the interposer 1004 may be formed of an epoxy resin, a fiberglass-reinforced epoxy resin, an epoxy resin with inorganic fillers, a ceramic material, or a polymer material such as polyimide. In some embodiments, the interposer 1004 may be formed of alternate rigid or flexible materials that may include the same materials described above for use in a semiconductor substrate, such as silicon, germanium, and other group III-V and group IV materials. The interposer 1004 may include metal interconnects 1008 and vias 1010, including but not limited to through hole vias 1010-1 (that extend from a first face 1050 of the interposer 1004 to a second face 1054 of the interposer 1004), blind vias 1010-2 (that extend from the first or second faces 1050 or 1054 of the interposer 1004 to an internal metal layer), and buried vias 1010-3 (that connect internal metal layers).

In some embodiments, the interposer 1004 can comprise a silicon interposer. Through silicon vias (TSV) extending through the silicon interposer can connect connections on a first face of a silicon interposer to an opposing second face of the silicon interposer. In some embodiments, an interposer 1004 comprising a silicon interposer can further comprise one or more routing layers to route connections on a first face of the interposer 1004 to an opposing second face of the interposer 1004.

The interposer 1004 may further include embedded devices 1014, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1004. The package-on-interposer structure 1036 may take the form of any of the package-on-interposer structures known in the art.

The integrated circuit device assembly 1000 may include an integrated circuit component 1024 coupled to the first face 1040 of the circuit board 1002 by coupling components 1022. The coupling components 1022 may take the form of any of the embodiments discussed above with reference to the coupling components 1016, and the integrated circuit component 1024 may take the form of any of the embodiments discussed above with reference to the integrated circuit component 1020.

The integrated circuit device assembly 1000 illustrated in FIG. 10 includes a package-on-package structure 1034 coupled to the second face 1042 of the circuit board 1002 by coupling components 1028. The package-on-package structure 1034 may include an integrated circuit component 1026 and an integrated circuit component 1032 coupled together by coupling components 1030 such that the integrated circuit component 1026 is disposed between the circuit board 1002 and the integrated circuit component 1032. The coupling components 1028 and 1030 may take the form of any of the embodiments of the coupling components 1016 discussed above, and the integrated circuit components 1026 and 1032 may take the form of any of the embodiments of the integrated circuit component 1020 discussed above. The package-on-package structure 1034 may be configured in accordance with any of the package-on-package structures known in the art.

Figure 11:
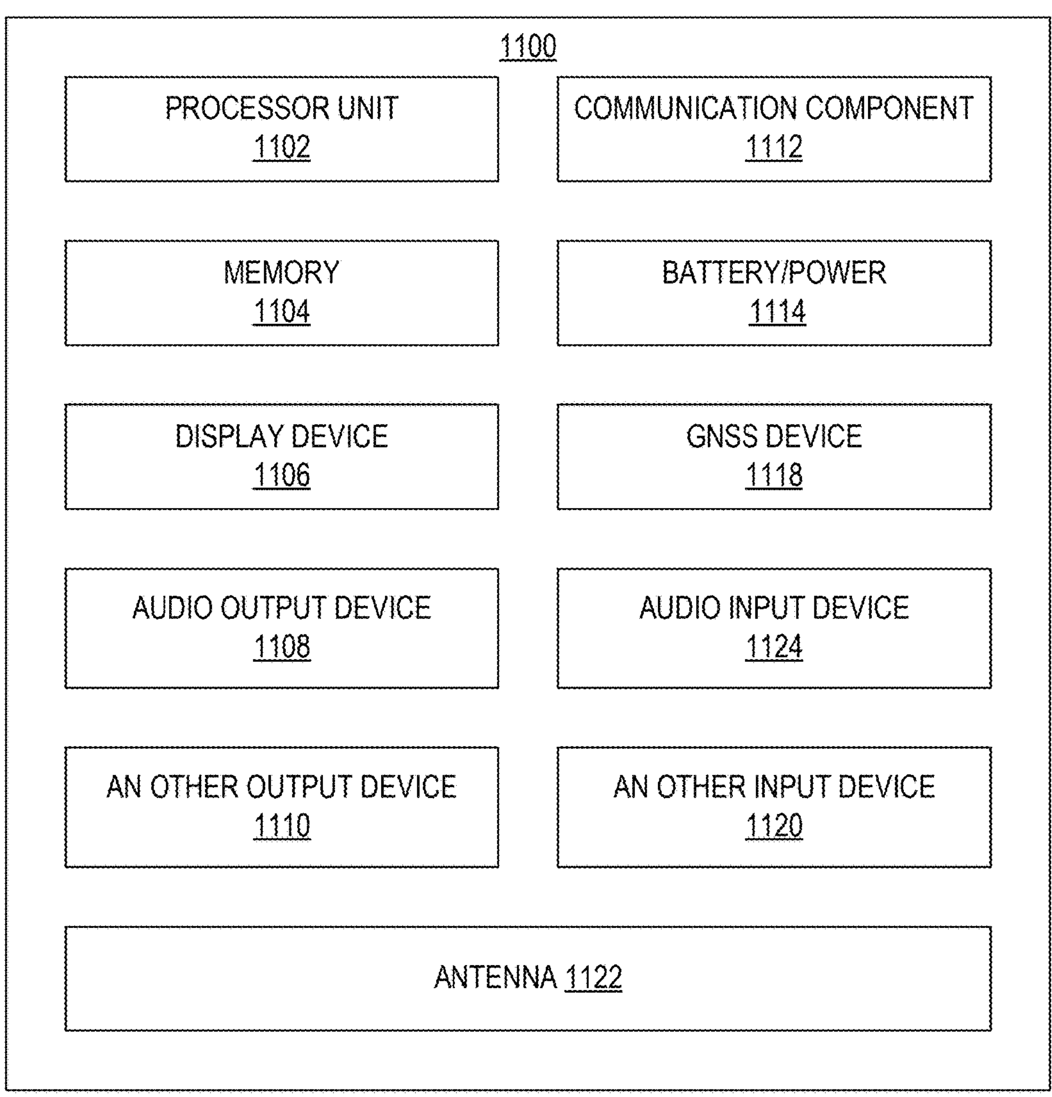
FIG. 11 is a block diagram of an example electrical device that may include a microelectronic assembly, in accordance with any of the embodiments disclosed herein.

FIG. 11 is a block diagram of an example electrical device 1100 that may include an integrated circuit component comprising one or more of the contacts disclosed herein. For example, any suitable ones of the components of the electrical device 1100 may include one or more of the integrated circuit device assemblies 1000, integrated circuit components 1020, integrated circuit devices 900, or integrated circuit dies 802 disclosed herein. A number of components are illustrated in FIG. 11 as included in the electrical device 1100, but any one or more of these components may be omitted or duplicated, as suitable for the application. In some embodiments, some or all of the components included in the electrical device 1100 may be attached to one or more motherboards mainboards, or system boards. In some embodiments, one or more of these components are fabricated onto a single system-on-a-chip (SoC) die.

Additionally, in various embodiments, the electrical device 1100 may not include one or more of the components illustrated in FIG. 11, but the electrical device 1100 may include interface circuitry for coupling to the one or more components. For example, the electrical device 1100 may not include a display device 1106, but may include display device interface circuitry (e.g., a connector and driver circuitry) to which a display device 1106 may be coupled. In another set of examples, the electrical device 1100 may not include an audio input device 1124 or an audio output device 1108, but may include audio input or output device interface circuitry (e.g., connectors and supporting circuitry) to which an audio input device 1124 or audio output device 1108 may be coupled.

The electrical device 1100 may include one or more processor units 1102 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1102 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 1100 may include a memory 1104, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 1104 may include memory that is located on the same integrated circuit die as the processor unit 1102. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 1100 can comprise one or more processor units 1102 that are heterogeneous or asymmetric to another processor unit 1102 in the electrical device 1100. There can be a variety of differences between the processing units 1102 in a system in terms of a spectrum of metrics of merit including architectural, microarchitectural, thermal, power consumption characteristics, and the like. These differences can effectively manifest themselves as asymmetry and heterogeneity among the processor units 1102 in the electrical device 1100.

In some embodiments, the electrical device 1100 may include a communication component 1112 (e.g., one or more communication components). For example, the communication component 1112 can manage wireless communications for the transfer of data to and from the electrical device 1100. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1112 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1112 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1112 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1112 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1112 may operate in accordance with other wireless protocols in other embodiments. The electrical device 1100 may include an antenna 1122 to facilitate wireless communications and/or to receive other wireless communications (such as AM or FM radio transmissions).

In some embodiments, the communication component 1112 may manage wired communications, such as electrical, optical, or any other suitable communication protocols (e.g., IEEE 802.3 Ethernet standards). As noted above, the communication component 1112 may include multiple communication components. For instance, a first communication component 1112 may be dedicated to shorter-range wireless communications such as Wi-Fi or Bluetooth, and a second communication component 1112 may be dedicated to longer-range wireless communications such as global positioning system (GPS), EDGE, GPRS, CDMA, WiMAX, LTE, EV-DO, or others. In some embodiments, a first communication component 1112 may be dedicated to wireless communications, and a second communication component 1112 may be dedicated to wired communications.

The electrical device 1100 may include battery/power circuitry 1114. The battery/power circuitry 1114 may include one or more energy storage devices (e.g., batteries or capacitors) and/or circuitry for coupling components of the electrical device 1100 to an energy source separate from the electrical device 1100 (e.g., AC line power).

The electrical device 1100 may include a display device 1106 (or corresponding interface circuitry, as discussed above). The display device 1106 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1100 may include an audio output device 1108 (or corresponding interface circuitry, as discussed above). The audio output device 1108 may include any embedded or wired or wirelessly connected external device that generates an audible indicator, such speakers, headsets, or earbuds.

The electrical device 1100 may include an audio input device 1124 (or corresponding interface circuitry, as discussed above). The audio input device 1124 may include any embedded or wired or wirelessly connected device that generates a signal representative of a sound, such as microphones, microphone arrays, or digital instruments (e.g., instruments having a musical instrument digital interface (MIDI) output). The electrical device 1100 may include a Global Navigation Satellite System (GNSS) device 1118 (or corresponding interface circuitry, as discussed above), such as a Global Positioning System (GPS) device. The GNSS device 1118 may be in communication with a satellite-based system and may determine a geolocation of the electrical device 1100 based on information received from one or more GNSS satellites, as known in the art.

The electrical device 1100 may include an other output device 1110 (or corresponding interface circuitry, as discussed above). Examples of the other output device 1110 may include an audio codec, a video codec, a printer, a wired or wireless transmitter for providing information to other devices, or an additional storage device.

The electrical device 1100 may include an other input device 1120 (or corresponding interface circuitry, as discussed above). Examples of the other input device 1120 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1100 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1100 may be any other electronic device that processes data. In some embodiments, the electrical device 1100 may comprise multiple discrete physical components. Given the range of devices that the electrical device 1100 can be manifested as in various embodiments, in some embodiments, the electrical device 1100 can be referred to as a computing device or a computing system.

As used in this application and the claims, a list of items joined by the term "and/or" can mean any combination of the listed items. For example, the phrase "A, B and/or C" can mean A; B; C; A and B; A and C; B and C; or A, B and C. As used in this application and the claims, a list of items joined by the term "at least one of" can mean any combination of the listed terms. For example, the phrase "at least one of A, B or C" can mean A; B; C; A and B; A and C; B and C; or A, B, and C. Moreover, as used in this application and the claims, a list of items joined by the term "one or more of" can mean any combination of the listed terms. For example, the phrase "one or more of A, B and C" can mean A; B; C; A and B; A and C; B and C; or A, B, and C.

As used in this application and the claims, a list of items stated or recited as having a trait, feature, etc. preceded by the word "individual" or "respective" means that all of the items in the list possess the stated or recited trait, feature, etc. For example, the phrase "individual of A, B, or C, comprise a sidewall" or "respective of A, B, or C, comprise a sidewall" means that A comprises a sidewall, B comprises sidewall, and C comprises a sidewall.

The disclosed methods, apparatuses, and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present or problems be solved.

Theories of operation, scientific principles, or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

Although the operations of some of the disclosed methods are described in a particular, sequential order for convenient presentation, it is to be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

The following examples pertain to additional embodiments of technologies disclosed herein.

Example 1 is an apparatus, comprising: a substrate comprising silicon; a fin extending from a surface of the substrate, the fin comprising silicon; a first layer positioned adjacent to and encompassing the fin along at least a portion of a length of the fin, the first layer comprising one or more outer surfaces not positioned adjacent to the surface of the substrate, the first layer comprising silicon; a second layer located on the one or more outer surfaces along at least a portion of a length of the first layer, the length of the first layer extending in a first direction parallel to the surface of the substrate, the length of the fin extending in the first direction, the second layer comprising a metal; and a monolayer positioned between the first layer and the second layer, the monolayer comprising: a transition metal; and sulfur, selenium, or tellurium.

Example 2 is an apparatus, comprising: a substrate comprising silicon; one or more first layers located above and separate from the substrate, the one or more first layers comprising silicon; a second layer positioned adjacent to and encompassing the one or more first layers along at least a portion of a length of individual of the one or more first layers, the second layer comprising silicon; a third layer located on and encompassing the second layer along at least a portion of a length of the second layer, the length of the individual first layers extending a first direction that is parallel to a surface of the substrate, the length of the second layer extending in the first direction, the third layer comprising a metal; and a monolayer positioned between the first layer the second layer, the monolayer comprising: a transition metal; and sulfur, selenium, or tellurium.

Example 3 is an apparatus, comprising: a substrate comprising silicon; a first layer located on a first region of the substrate, the first region extending from a surface of the substrate to a depth within the substrate, the first layer comprising a metal, the first region comprising an n-type dopant or a p-type dopant; and a monolayer positioned between the first layer and the first region, the monolayer comprising: a transition metal; and sulfur, selenium, or tellurium.

Example 4 comprises the apparatus of any one of Examples 1-3, wherein the monolayer comprises a transition metal dichalcogenide.

Example 5 comprises the apparatus of any one of Examples 1-3, wherein the monolayer comprises tellurium and the transition metal of the monolayer is molybdenum.

Example 6 comprises the apparatus of any one of Examples 1-3, wherein the monolayer comprises selenium and the transition metal of the monolayer is molybdenum.

Example 7 comprises the apparatus of any one of Examples 1-3, wherein the monolayer comprises sulfur and the transition metal of the monolayer is molybdenum.

Example 8 comprises the apparatus of any one of Examples 1-3, wherein the monolayer comprises tellurium and the transition metal of the monolayer is tungsten.

Example 9 comprises the apparatus of any one of Examples 1-3, wherein the monolayer comprises selenium and the transition metal of the monolayer is tungsten.

Example 10 comprises the apparatus of any one of Examples 1-3, wherein the monolayer comprises sulfur and the transition metal of the monolayer is tungsten.

Example 11 comprises the apparatus of any one of Examples 1-3, wherein the monolayer comprises tellurium and the transition metal of the monolayer is platinum.

Example 12 comprises the apparatus of any one of Examples 1-3, wherein the monolayer comprises selenium and the transition metal of the monolayer is platinum.

Example 13 comprises the apparatus of any one of Examples 1-3, wherein the monolayer comprises sulfur and the transition metal of the monolayer is platinum.

Example 14 comprises the apparatus of any one of Examples 1-3, wherein the monolayer comprises tellurium and the transition metal of the monolayer is titanium.

Example 15 comprises the apparatus of any one of Examples 1-3, wherein the monolayer comprises selenium and the transition metal of the monolayer is titanium.

Example 16 comprises the apparatus of any one of Examples 1-3, wherein the monolayer comprises sulfur and the transition metal of the monolayer is titanium.

Example 17 comprises the apparatus of any one of Examples 1-3, wherein the monolayer comprises tellurium and the transition metal of the monolayer is erbium.

Example 18 comprises the apparatus of any one of Examples 1-3, wherein the monolayer comprises selenium and the transition metal of the monolayer is erbium.

Example 19 comprises the apparatus of any one of Examples 1-3, wherein the monolayer comprises sulfur and the transition metal of the monolayer is erbium.

Example 20 comprises the apparatus of any one of Examples 1-3, wherein the monolayer comprises tellurium and the transition metal of the monolayer is lanthanum.

Example 21 comprises the apparatus of any one of Examples 1-3, wherein the monolayer comprises selenium and the transition metal of the monolayer is lanthanum.

Example 22 comprises the apparatus of any one of Examples 1-3, wherein the monolayer comprises sulfur and the transition metal of the monolayer is lanthanum.

Example 23 comprises the apparatus of any one of Examples 1-3, wherein the monolayer comprises erbium and tellurium and the transition metal of the monolayer is rhodium.

Example 24 comprises the apparatus of any one of Examples 1-3, wherein the monolayer comprises selenium and the transition metal of the monolayer is rhodium.

Example 25 comprises the apparatus of any one of Examples 1-3, wherein the monolayer comprises sulfur and the transition metal of the monolayer is rhodium.

Example 26 comprises the apparatus of any of Examples 1, 4-25, wherein the second layer comprises one or more of tungsten, cobalt, titanium, gold, aluminum, molybdenum, chromium, and nickel.

Example 27 comprises the apparatus of any one of Examples 1, 4-26, wherein the first layer comprises an n-type dopant.

Example 28 comprises the apparatus of Example 27, wherein the n-type dopant is phosphorous, arsenic, or antimony.

Example 29 comprises the apparatus of Example 27, wherein the transition metal of the monolayer is erbium, lanthanum, or titanium.

Example 30 comprises the apparatus of Examples 1, 4-25, wherein the first layer comprises an p-type dopant.

Example 31 comprises the apparatus of Example 30, wherein the p-type dopant is boron, gallium, or indium.

Example 32 comprises the apparatus of Example 30, wherein the transition metal of the monolayer is platinum or rhodium.

Example 33 comprises the apparatus of Example 30, wherein the first layer further comprises germanium.

Example 34 comprises the apparatus of any one of Examples 1, 4-33, the monolayer positioned adjacent to the one or more outer surfaces of the first layer.

Example 35 comprises the apparatus of any one of Examples 1, 4-34, wherein the first layer comprising silicon is at least part of a source region or a drain region of a transistor.

Example 36 comprises the apparatus of any one of Examples 1, 4-35, wherein the second layer is positioned adjacent to the first layer.

Example 37 comprises the apparatus of any one of Examples 1, 4-36, wherein a third layer is positioned between the second layer and the monolayer, the third layer comprising: tantalum; ruthenium; titanium; titanium and nitrogen; indium; or indium and oxygen.

Example 38 comprises the apparatus of any one of Examples 2, 4-25, wherein the third layer comprises one or more of tungsten, cobalt, titanium, gold, aluminum, molybdenum, chromium, and nickel.

Example 39 comprises the apparatus of any one of Examples 2, 4-25, 38, wherein the second layer comprises an n-type dopant.

Example 40 comprises the apparatus of Example 39, wherein the n-type dopant is phosphorous, arsenic, or antimony.

Example 41 comprises the apparatus of Example 39, wherein the transition metal of the monolayer is erbium, lanthanum, or titanium.

Example 42 comprises the apparatus of any one of Examples 2, 4-25, 38, wherein the second layer comprises a p-type dopant.

Example 43 comprises the apparatus of Example 42, wherein the p-type dopant is boron, gallium, or indium.

Example 44 comprises the apparatus of Example 42, wherein the transition metal of the monolayer is platinum or rhodium.

Example 45 comprises the apparatus of Example 42, wherein the first layers and the second layer further comprise germanium.

Example 46 comprises the apparatus of any one of Examples 2, 4-25, 38-45, wherein the one or more first layers are at least part of one or more source regions or one or more drain regions of a transistor.

Example 47 comprises the apparatus of any one of Examples 2, 4-25, 38-46, wherein the one or more first layers are a plurality of first layers stacked vertically with respect to a surface of the substrate.

Example 48 comprises the apparatus of any one of Examples 2, 4-25, 38-47, wherein the third layer is positioned adjacent to the second layer.

Example 49 comprises the apparatus of Example 2, wherein a fourth layer is positioned between the third layer and the monolayer, the fourth layer comprising: tantalum; ruthenium; titanium; titanium and nitrogen; indium; or indium and oxygen.

Example 50 comprises the apparatus of any one of Examples 3-25, wherein the first layer comprises one or more of tungsten, cobalt, titanium, gold, aluminum, molybdenum, chromium, and nickel.

Example 51 comprises the apparatus of any one of Examples 3-25, 50, wherein the first region comprises an n-type dopant.

Example 52 comprises the apparatus of Example 51, wherein the n-type dopant is phosphorous, arsenic, or antimony.

Example 53 comprises the apparatus of Example 51, wherein the transition metal of the monolayer is erbium, lanthanum, or titanium.

Example 54 comprises the apparatus of any one of Examples 3-25, 50, wherein the first region comprises a p-type dopant.

Example 55 comprises the apparatus of Example 54, wherein the p-type dopant is boron, gallium, or indium.

Example 56 comprises the apparatus of Example 54, wherein the transition metal of the monolayer is platinum or rhodium.

Example 57 comprises the apparatus any one of Examples 3-25, 50-56, wherein the first region further comprises germanium.

Example 58 comprises the apparatus any one of Examples 3-25, 50-57, wherein the first region is part of a source region or a drain region of a transistor.

Example 59 comprises the apparatus any one of Examples 3-25, 50-58, wherein the first layer is positioned adjacent to the first region.

Example 60 comprises the apparatus of Example 3, wherein a second layer is positioned between the first layer and the monolayer, the second layer comprising: tantalum; ruthenium; titanium; titanium and nitrogen; indium; or indium and oxygen.

Example 61 comprises the apparatus of any one of Examples 1-60, wherein the apparatus is a processor unit.

Example 62 comprises the apparatus of any one of Examples 1-60, wherein the apparatus is an integrated circuit component.

Example 63 comprises the apparatus of any one of Examples 1, 4-37, wherein the apparatus comprises: a printed circuit board; and a first integrated circuit component attached to the printed circuit board, the first integrated circuit component comprising the substrate, the fin, first layer, the second layer, and the monolayer.

Example 64 comprises the apparatus of Example 63, wherein the apparatus further comprises one or more second integrated circuit components attached to the printed circuit board.

Example 65 comprises the apparatus of Example 63, wherein the apparatus further comprises a housing enclosing the printed circuit board and the first integrated circuit component.

Example 66 is a method, comprising: forming a semiconductor layer or region, the semiconductor layer or region comprising silicon; forming a monolayer comprising: a transition metal; and sulfur, selenium, or tellurium, the monolayer positioned adjacent to the semiconductor layer or region; and forming a first layer located on the monolayer, the first layer comprising a metal.

Example 67 comprises the method of Example 66, wherein forming the semiconductor layer or region comprises epitaxially growing the semiconductor layer or region.

Example 68 comprises the method of Example 66 or 67, wherein the transition metal comprises platinum, tungsten, titanium, molybdenum, erbium, lanthanum, or rhodium.

Example 69 comprises the method of any one of Examples 66-68, wherein the metal of the first layer comprises one or more of tungsten, cobalt, titanium, gold, aluminum, molybdenum, chromium, and nickel.

Example 70 comprises the method of any one of Examples 66-69, wherein the semiconductor layer or region is a semiconductor region that is part of a substrate, the semiconductor region extending from a surface of the substrate to a depth within the substrate, the substrate comprising silicon.

Example 71 comprises the method of any one of Examples 66-70, wherein the semiconductor layer or region further comprises germanium.

Example 72 comprises the method of any one of Examples 66-71, wherein the semiconductor layer or region comprises an n-type dopant.

Example 73 comprises the method of Example 72, wherein the n-type dopant is phosphorous, arsenic, or antimony.

Example 74 comprises the method of Example 66, wherein the transition metal of the monolayer is erbium, lanthanum, or titanium.

Example 75 comprises the method of any one of Examples 66-71, wherein the semiconductor layer or region comprises an p-type dopant.

Example 76 comprises the method of Example 75, wherein the p-type dopant is boron, gallium, or indium.

Example 77 comprises the method of Example 75, wherein the transition metal of the monolayer is platinum or rhodium.

Example 78 comprises the method of any one of Examples 66-77, wherein the first layer is positioned adjacent to the semiconductor layer or region.

Example 79 comprises the method of any one of Examples 66-78, further comprising forming a second layer prior to forming the first layer, the second layer positioned between the semiconductor layer or region and the first layer, the second layer comprising: tantalum; ruthenium; titanium; titanium and nitrogen; indium; or indium and oxygen.

Example 80 comprises the method of any one of Examples 66-79, further comprising forming a fin prior to forming the semiconductor layer or region, the fin extending from a surface of a substrate, the semiconductor layer or region positioned adjacent to and encompassing the fin along at least a portion of a length of the fin, the semiconductor layer or region comprising one or more outer surfaces not positioned adjacent to the surface of a substrate, the first layer located on and encompassing the one or more outer surfaces along at least a portion of a length of the semiconductor layer or region, the length of the semiconductor layer or region extending a first direction parallel to the surface of the substrate, the length of the fin extending in the first direction, the fin comprising silicon.

Example 81 comprises the method of Example 80, wherein the fin further comprises germanium.

Example 82 comprises the method of any one of Examples 66-79, further comprising forming one or more second layers located above and separate from a substrate, the semiconductor layer or region positioned adjacent to and encompassing the one or more second layers along at a least a portion of a length of individual of the one or more second layers, the first layer located on and encompassing at least a portion of a length of the semiconductor layer or region, the length of the first layer extending in a first direction parallel to a surface of the substrate, the length of the individual one or more second layers extending in the first direction, the one or more second layers comprising silicon.

Example 83 comprises the method of Example 82, wherein the one or more second layers further comprise germanium.

Example 84 comprises the method of Example 82, wherein the one or more second layers are a plurality of second layers stacked vertically with respect to a surface of the substrate.

The invention claimed is:

1. An apparatus, comprising:

a lower layer comprising silicon;

a first fin extending from a surface of the lower layer, the first fin comprising silicon;

a first layer positioned adjacent to and encompassing the first fin along at least a portion of a length of the first fin, the first layer comprising silicon and an n-type dopant;

a second layer located on at least a portion of a length of the first layer, the length of the first layer extending in a first direction parallel to the surface of the lower layer, the length of the first fin extending in the first direction, the second layer comprising a first metal;

a first monolayer positioned between the first layer and the second layer, the first monolayer comprising a transition metal dichalcogenide (TMD) comprising:

a transition metal; and sulfur, selenium, or tellurium;

a second fin extending from the surface of the lower layer;

a third layer positioned adjacent to and encompassing the second fin along at least a portion of a length of the second fin, the third layer comprising silicon and a p-type dopant;

a fourth layer located on at least a portion of a length of the third layer, the length of the third layer extending in the first direction, the length of the second fin extending in the first direction, the fourth layer comprising the first metal; and a second monolayer positioned between the third layer and the fourth layer, the second monolayer comprising the transition metal of the TMD and omitting sulfur, selenium, and tellurium.

2. The apparatus of claim 1, wherein the transition metal of the first monolayer is molybdenum, tungsten, platinum, or titanium.

3. The apparatus of claim 1, wherein the transition metal of the first monolayer is erbium, lanthanum, or titanium.

4. The apparatus of claim 1, wherein the second layer comprises one or more of tungsten, cobalt, titanium, gold, aluminum, molybdenum, chromium, and nickel.

5. The apparatus of claim 1, wherein the first layer comprises phosphorous, arsenic, or antimony.

6. The apparatus of claim 1, wherein the third layer comprises boron, gallium, or indium.

7. The apparatus of claim 1, wherein the first layer further comprises germanium.

8. The apparatus of claim 1, the first monolayer is positioned adjacent to one or more outer surfaces of the first layer.

9. The apparatus of claim 1, wherein the apparatus is an integrated circuit component.

10. The apparatus of claim 1, wherein the apparatus further comprises:

a printed circuit board; and a first integrated circuit component attached to the printed circuit board, the first integrated circuit component comprising the lower layer, the first fin, the second fin, the first layer, the second layer, the third layer, the fourth layer, the first monolayer, and the second monolayer.

11. The apparatus of claim 10, wherein the apparatus further comprises one or more second integrated circuit components attached to the printed circuit board.

12. The apparatus of claim 1, wherein the transition metal comprises molybdenum and the second layer comprises molybdenum.

13. An apparatus, comprising:

a lower layer comprising silicon, the lower layer further comprising a first region including an n-type dopant and a second region including a p-type dopant;

a first layer located above a surface of the lower layer and positioned on the first region of the lower layer, the first region extending from the surface of the lower layer to a depth within the lower layer, the first layer comprising a first metal;

a first monolayer positioned between the first layer and the first region, the first monolayer comprising:

a transition metal; and sulfur, selenium, or tellurium;

a second layer located above the surface of the lower layer and positioned on the second region of the lower layer, the second layer comprising the first metal; and a second monolayer positioned between the second layer and the second region, the second monolayer comprising the transition metal without including any one of sulfur, selenium, or tellurium.

14. The apparatus of claim 13, wherein the first monolayer comprises a transition metal dichalcogenide.

15. The apparatus of claim 13, wherein the transition metal of the first monolayer is molybdenum, tungsten, platinum, or titanium.

16. The apparatus of claim 13, wherein the transition metal of the first monolayer is erbium, lanthanum, or titanium.

17. The apparatus of claim 13, wherein the first layer comprises one or more of tungsten, cobalt, titanium, gold, aluminum, molybdenum, chromium, and nickel.

18. The apparatus of claim 13, wherein the first region comprises phosphorous, arsenic, or antimony.

19. The apparatus of claim 13, wherein the second region comprises boron, gallium, or indium.

20. The apparatus of claim 13, wherein the first region further comprises germanium.

21. The apparatus of claim 13, wherein the apparatus is an integrated circuit component.

22. The apparatus of claim 13, wherein the apparatus further comprises:

a printed circuit board; and a first integrated circuit component attached to the printed circuit board, the first integrated circuit component comprising the lower layer, the first layer, the first monolayer, the second layer, and the second monolayer.

23. The apparatus of claim 22, wherein the apparatus further comprises one or more second integrated circuit components attached to the printed circuit board.

24. The apparatus of claim 13, wherein the transition metal comprises molybdenum and the second layer comprises molybdenum.

* * * * *